US010139295B2

(12) United States Patent
Yu et al.

(10) Patent No.: US 10,139,295 B2
(45) Date of Patent: Nov. 27, 2018

(54) METHODS FOR IN-PLANE STRAIN MEASUREMENT OF A SUBSTRATE

(71) Applicant: ARIZONA BOARD OF REGENTS ON BEHALF OF ARIZONA STATE UNIVERSITY, Scottsdale, AZ (US)

(72) Inventors: Hongbin Yu, Chandler, AZ (US); Hanqing Jiang, Chandler, AZ (US); Hanshuang Liang, Mesa, AZ (US); Teng Ma, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/154,959

(22) Filed: May 14, 2016

(65) Prior Publication Data
US 2016/0363492 A1 Dec. 15, 2016

Related U.S. Application Data

(60) Continuation-in-part of application No. 14/081,466, filed on Nov. 15, 2013, now abandoned, which is a (Continued)

(51) Int. Cl.
*G01L 1/24* (2006.01)
*G01L 1/00* (2006.01)
*H01L 21/66* (2006.01)

(52) U.S. Cl.
CPC ............... *G01L 1/241* (2013.01); *G01L 1/00* (2013.01); *H01L 22/12* (2013.01); *Y10T 428/24446* (2015.01)

(58) Field of Classification Search
CPC .................................................. G01B 11/165
See application file for complete search history.

(56) References Cited

U.S. PATENT DOCUMENTS

| 5,115,344 A | 5/1992 | Jaskie |
| 6,584,857 B1 | 7/2003 | Furlani et al. |

(Continued)

OTHER PUBLICATIONS

Asundi, Anand, and Bing Zhao. "Optical strain sensor using position-sensitive detector and diffraction grating: error analysis." Optical Engineering 39.6 (2000): 1645-1651.*

(Continued)

*Primary Examiner* — Shawn Decenzo
(74) *Attorney, Agent, or Firm* — Michael Best & Friedrich LLP

(57) ABSTRACT

Methods for measuring and/or mapping in-plane strain of a surface of a substrate. A grating is formed on at least a portion of the surface of the substrate. A laser is then used focused onto the grating to determine the strain on the surface by determining the variation of the grating wavelength due to the strain on the surface. The strain information is essentially carried by the grating, in terms of grating wavelength, because it varies according to the volume change of the underlying substrates. By scanning the surface grating with the small laser size, a high resolution strain map of the surface can be produced. The induced strain is related to the grating wavelength variation, which leads to the diffraction angle variation that is captured by the strain sensing measurements.

19 Claims, 33 Drawing Sheets

Related U.S. Application Data continuation of application No. PCT/US2014/065776, filed on Nov. 14, 2014, which is a division of application No. 14/081,466, filed on Nov. 15, 2013, now abandoned.

(60) Provisional application No. 61/726,773, filed on Nov. 15, 2012, provisional application No. 61/904,621, filed on Nov. 15, 2013, provisional application No. 61/951,646, filed on Mar. 12, 2014.

(56) References Cited

U.S. PATENT DOCUMENTS

| | | | |
|---|---|---|---|
| 7,477,362 B2* | 1/2009 | Asundi | G01B 11/161 250/237 G |
| 2006/0113279 A1 | 6/2006 | Little | |
| 2007/0166845 A1 | 7/2007 | Yokokawa | |
| 2008/0125510 A1 | 5/2008 | Crosby et al. | |
| 2008/0144001 A1* | 6/2008 | Heeg | G01J 3/12 356/32 |
| 2009/0297776 A1 | 12/2009 | Crosby et al. | |
| 2009/0310209 A1 | 12/2009 | Aschwanden et al. | |
| 2009/0310221 A1 | 12/2009 | Aschwanden | |
| 2010/0143677 A1 | 6/2010 | Lee et al. | |
| 2010/0149640 A1 | 6/2010 | Paek et al. | |
| 2010/0307705 A1* | 12/2010 | Rahm | B42D 25/29 162/140 |
| 2012/0143525 A1* | 6/2012 | Chen | G01M 5/0025 702/42 |
| 2012/0146050 A1 | 6/2012 | Adam et al. | |
| 2012/0212820 A1 | 8/2012 | Jiang et al. | |
| 2012/0292504 A1 | 11/2012 | Nojima | |

OTHER PUBLICATIONS

Cheryl S. Selvanayagam et al., "Nonlinear Thermal Stress/Strain Analyses of Copper Filled TSV (Through Silicon Via) and their Flip-Chip Microbumps" 32 III Trans. Adv. Pack. 720 (2009).
James S. Sharp and Richard. A. L. Jones, "Micro-buckling as a Route Towards Surface Patterning" 14 Adv. Mater. 799 (2002).
Pimpon Uttayarat et al., "Topographic Guidance of endothelial Cells on Silicone Sufraces with Micro- to Nanogrooves: Orientation of Actin Filaments and Focal Adhesions" 75 J. Biomed. Mater. Res. A 668 (2005).
Cunjiang Yu and Hanqing Jiang, "Forming Wrinkled Stiff Films on Polymeric Substrates at Room Temperature for Stretchable Interconnects Applications" 519 Thin Solid Films 818 (2010).
C. Yu et al., "Stretchable Supercapacitors Based on Buckled Single-Walled Carbon Nanotube Macrofilms", Adv. Mater., 21, pp. 4793-4797 (2009).
C. Yu et al., "A stretchable temperature sensor based on elastically buckled thin film devices on elastomeric substrates", Appl. Phys. Lett. 95, 141902 (2009).
H. Jiang et al., Finite deformation mechanics in buckled thin films on compliant supports, PNAS, vol. 104., No. 40, pp. 15607-15612 (2007).
D.-Y. Khang et al., "A Stretchable Form of Single-Crystal Silicon for High-Performance Electronics on Rubber Substrates", Science, vol. 311 pp. 208-212 (2006).
S.P. Lacour et al., "Stretchable Interconnects for Elastic Electronic Surfaces", Proc. IEEE, vol. 93, No. 8, pp. 1459-1467 (2005).
International Search Report and Written Opinion for PCT/US2014/065776, dated Apr. 22, 2015.
T Ma et al., "Micro-strain sensing using wrinkled stiff thin films on soft substrates as tunable optical grating", Optics Express, vol. 21, No. 10, pp. 11994-12001 (2013).
X. Jiang et al., "Controlling Mammalian Cell Spreading and Cytoskeletal Arrangement with Conveniently Fabricated continuous Wavy Features on Poly(dimethylsiloxane)", Langmuir 18(8), 3273-3280 (2002).
S. Wagner et al., "Electronic skin: architecture and components," Physica E 25(2-3), 326-334 (2004).
S. P. Lacour et al., "Design and performance of thin metal film interconnects for skin-like electronic circuits," IEEE Electron Device Lett. 25(4), 179-181 (2004).
S. P. Lacour et al., "Stretchable gold conductors on elastomeric substrates," Appl. Phys. Lett. 82(15), 2404-2406 (2003).
S. P. Lacour, S. Wagner, R. J. Narayan, T. Li, and Z. Suo, "Stiff subcircuit islands of diamondlike carbon for stretchable electronics," J. Appl. Phys. 100(1), 014913 (2006).
H. Q. Jiang et al., "Mechanics of precisely controlled thin film buckling on elastomeric substrate," Appl. Phys. Lett. 90(13), 133119 (2007).
K.M. Choi et al., "A photocurable poly(dimethylsiloxane) chemistry designed for soft lithographic molding and printing in the nanometer regime," J. Am. Chem. Soc. 125(14), 4060-4061 (2003).
Äyräs P. et al., "Diffraction Gratings in Sol-gel Films by Direct Contact Printing Using a UV-mercury Lamp" 162 Opt. Comms. 215-218 (1999).
Fang Y. et al., "Resonant Waveguild Grating Biosensor for Living Cell Sensing" 91 Biophys. J. 1925-940 (2006).
Gudeman CS. et al., "Using the Grating Lite Valve Device as a Multichannel Variable Optical Attenuator (VOA) for the 1.55-µm Spectral Region" 4653 Proc. SPIE 56-61 (2002).
Albert K. Harris et al., "Silicone Rubber Substrata: A New Wrinkle in the Study of Cell Locomotion" 208 Science 177-179 (1980).
Huang R., "Kinetic Wrinkling of an Elastic Film on a Viscoelastic Substrate" 53 J. Mech. Phys. Solids 63-89 (2005).
Z. Y. Huang et al., "Nonlinear Analyses of Wrinkles in a Film Bonded to a Compliant Substrate" 53 J. Mech. Phys. Solids 2101-118 (2005).
Wilhelm T. S. Huck et al., "Ordering of Spontaneously Formed Buckles on Planar Surfaces" 16 Langmuir 3497-501 (2001).
Hanqing Jiang et al., "Finite Width Effect of Thin-films Buckling on Compliant substrate: Experimental and Theoretical Studies" 56 J. Mech. Phys. Solids 2585-598 (2008).
Cunjiang Yu et al., "Thermoresponsiveness of Integrated Ultra-Thin Silicon with Poly(N-isopropylacrylamide) Hydrogels" 32 Macromol. Rapid Commun. 820 (2011).
Cunjiang Yu et al., "Silicon Thin Films as Anodes for High-Performance Lithium-Ion batteries with Effective Stress Relaxation" 2 Adv. Energy Mater. 68 (2012).
David C. Duffy et al., "Rapid Prototyping of Microlluidic Systems in Poly(dimethylsiloxane)" 70 Anal. Chem. 4974 (1998).
Daniel H. Raguin and G. Michael Morris, "Antireflection Structured Surfaces for the Infrared Spectral Region" 32 Appl. Opt. 1154-167 (1993).
Christopher M. Stafford et al., "A Buckling-based Metrology for Measuring the Elastic Moduli of Polymetric Thin Films" 3 Nat. Mater. 545-550 (2004).
Chee Wei Wong et al., "Analog Tunable Gratings Driven by Thin-film Piezoelectric Microelectromechanical Actuators" 42 Appl. Opt. 621-626 (2003).
A. Azzam Yasseen et al., "Diffraction Grating Scanners Using Polysilicon Micromotors" 5 IEEE J. Sel. Top. Quantum Electron. 75-82 (1999).
M. Ouyang et al., "Conversion of Some Siloxane Polymers to Silicon Oxide by UV/Ozone Photochemical Processes" 12 Chem. Mater. 1591 (2000).
E. Cerda et al., "Thin Films: Wrinkling of an Elastic Sheet Under Tension" 419 Nature 579 (2002).
Christopher Harrison et al., "Sinusoidal Phase Grating Created by a Tunably Buckled Surface" 85 Appl. Phys. Lett. 4016-4018 (2004).
Ned Bowden et al., "Spontaneous Formation of Ordered Structures in Thin Films of Metals Supported on an Elastomeric Polymer" 393 Nature 146-149 (1998).
Takuya Ohzono and Masatsugu Shimomura, "Geometry-dependent Stripe Rearrangement Processes Induced by Strain on Preordered Microwrinkle Patterns" 21 Langmuir 7230-7237 (2005).
Kevin Chen et al., "Facile Large-area Photolithography of Periodic Sub-micron Structures Using a Self-formed Polymer Mask" 100 App. Phys. Lett 233503 (2012).
F.S. Chen et al., "Holographic Storage in Lithium Niobate" 13 Appl. Phys. Lett. 223 (1968).

(56) References Cited

OTHER PUBLICATIONS

Kahp Y. Suh et al., "A Simple Soft Lithographic Route to Fabrication of Poly(ethylene glycol) Microstructures for Protein and Cell Patterning" 25 Biomaterials 557 (2004).

Anne Horn et al., "Ordering and Printing Virus Arrays: A straightforward Way to Functionalize Surfaces" 6 Small 2122 (2010).

Jonathan G. C. Veinot et al., "Fabrication and Properties of Organic Light-Emitting "Nanodiode" Arrays" 2 Nano Lett. 333 (2002).

Yoshihiro Koide et al., "Hot Microcontact Printing for Patterning ITO Surfaces. Methodology, Morphology, Microstructure, and OLED Charge Injection Barrier Imaging" 19 Langmuir 86 (2003).

Cunjiang Yu et al., "Tunable Optical Gratings Based on Buckled Nanoscale Thin Films on Transparent Elastomeric Substrates" 96 Appl. Phys. Lett. 041111 (2010).

Zhiyong Fan et al., "Three-dimensional Nanopillar-array Photovoltaics on Low-cost and Flexible Substrates" 8 Nat. Mat. 648 (2009).

C. Vieu et al., "electron Beam Lithography: Resolution Limits and Applications" 164 Appl. Surf. Sci. 111 (2000).

Burn Jeng Lin, "Deep UV Lithography" 12 J. Vac. Sci. Technol. 1317 (1975).

Leon A. Woldering et al., "Periodic Arrays of Deep Nanopores Made in Silicon with Reactive Ion Etching and Deep UV Lithography" 19 Nanotechnology 145304 (2008).

Dong Sik Kim et al., "Laser-Interference Lithography Tailored for Highly Symmetrically Arranged ZnO Nanowire Arrays" 3 Small 76 (2007).

Johannes de Boor et al., "Three-beam Interference Lithography: Upgrading a Lloyd's Interferometer for Single-exposure Hexagonal Patterning" 34 Opt. Lett. 1783 (2009).

Ampere A Tseng et al., "Nanofabrication by Scanning Probe Microscope Lithography: A Review" 23 J. Vac. Sci. Technol. B 877 (2005).

Younan Xia et al., "Unconventional Methods for Fabricating and Patterning Nanostructures" 99 Chem. Rev. 1823 (1999).

L. Jay Guo, "Nanoimprint Lithography: Methods and Material Requirements" 19 Adv. Mater. 495 (2007).

Helmut Schift, "Nanoimprint Lithography: An Old Story in Modern Times? A Review" 26 J. Vac. Sci. Technol. B 458 (2008).

J. Y. Cheng et al., "Fabrication of Nanostructures with Long-range Order Using Block Copolymer Lithography" 81 Appl. Phys. Lett. 3657 (2002).

Tae-Woo Lee et al., "Soft-Contact Optical Lithography Using Transparent Elastomeric Stamps: Application to Nanopatterned Organic Light-Emitting Devices" 15 Adv. Funct. Mater. 1435 (2005).

John A. Rogers et al., "Using an Elastomeric Phase Mask for Sub-100nm Photolithography in the Optical Near Field" to Appl. Phys. Lett. 2658 (1997).

Dong Qin et al., "Photolithography with Transparent Reflective Photomasks" 16 J. Vac. Sci. Technol. B 98 (1998).

Zhi-Yuan Li et al., "Optimization of Elastomeric Phase Masks for Near-field Photolithography" 78 Appl. Phys. Lett. 2431 (2001).

John A. Rogers et al., "Generating ~90 Nanometer Features Using Near-field Contact-mode Photolithography with an Elastomeric Phase Mask" 16 J. Vac. Sci. Technol. B 59 (1998).

Daniel J. Shir et al., "Three-Dimensional Nanofabrication with Elastomeric Phase Masks" 111 J. Phys. Chem. B 12945 (2007).

Alexandra Schweikart and Andreas Fery, "Controlled Wrinkling as a Novel Method for the Fabrication of Patterned Surfaces" 165 Microchim. Acta 249 (2009).

Won Mook Choi et al., "Biaxially Stretchable "Wavy" Silicon Nanomembranes" 7 Nano Lett. 1655 (2007).

Kirill Efimenko et al., "Nested Self-similar Wrinkling Patterns in Skins" 4 Nat. Mater. 293 (2005).

Byung-Ho Jo et al., "Three-Dimensional Micro-Channel Fabrication in Polydimethylsiloxane (PDMS) Elastomer" 9 J. Microelectromech. Syst. 76 (2000).

Conghua Lu et al., "A Lithography-free Method for Directed Colloidal Crystal Assembly Based on Wrinkling" 3 Soft Matter 1530 (2007).

Heinz Schmid et al., "Preparation of Metallic Films on Elastomeric Stamps and their Application for Contact Processing and Contact Printing" 13 Adv. Funct. Mater. 145 (2003).

\* cited by examiner

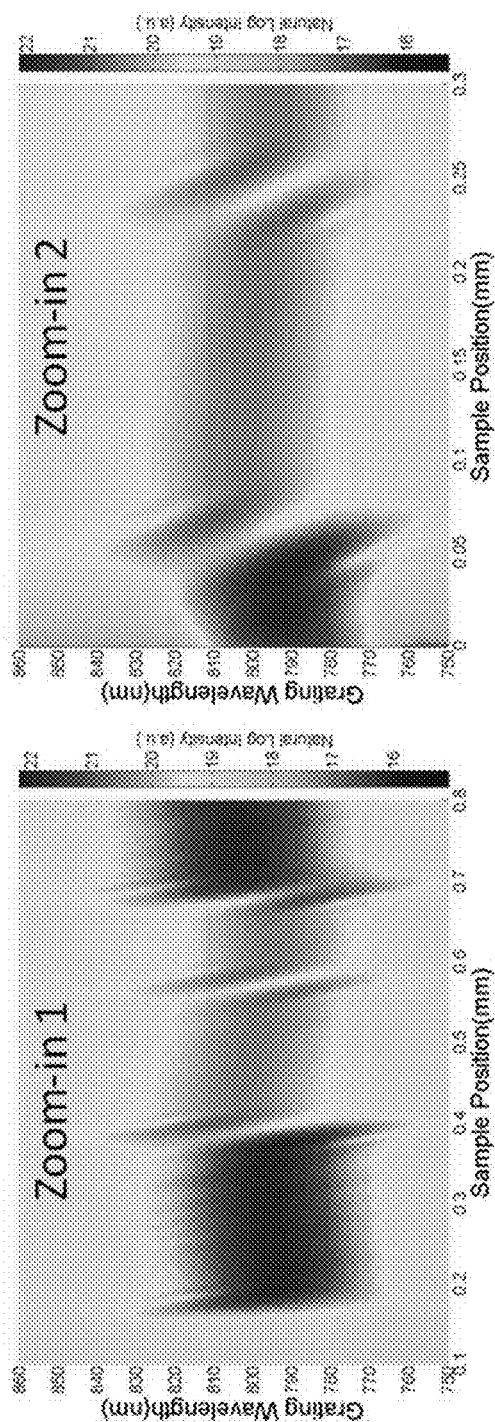
FIGURE 9C (2)
FIGURE 9C (1)

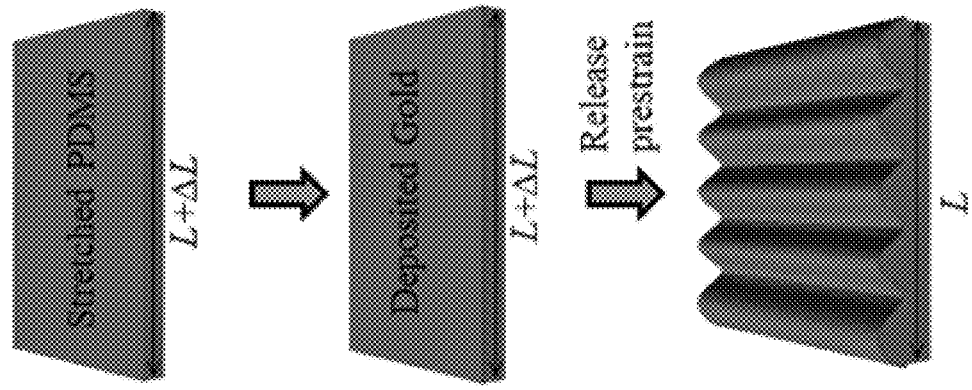

METHODS FOR IN-PLANE STRAIN MEASUREMENT OF A SUBSTRATE

CROSS-REFERENCE TO RELATED APPLICATIONS

This application is a continuation-in-part of U.S. patent application Ser. No. 14/081,466, filed Nov. 15, 2013, which claims priority to U.S. Provisional Patent Application No. 61/726,773, filed Nov. 15, 2012. This application is a continuation of PCT International Application No. PCT/US2014/065776, filed Nov. 14, 2014, which is a continuation-in-part of U.S. patent application Ser. No. 14/081,466, filed Nov. 15, 2013, which claims priority to U.S. Provisional Patent Application No. 61/726,773, filed Nov. 15, 2012. The PCT International Application No. PCT/US2014/065776, filed Nov. 14, 2014 is a non-provisional of and claims priority to U.S. Provisional Patent Application No. 61/904,621, filed Nov. 15, 2013, and U.S. Provisional Patent Application No. 61/951,646, filed Mar. 12, 2014. The disclosures of all these applications are incorporated herein by reference.

STATEMENT REGARDING FEDERALLY SPONSORED RESEARCH OR DEVELOPMENT

This invention was made with government support under grant numbers CMMI-0700440, ECCS-0926017, and IIP-1343474 awarded by the National Science Foundation. The Government has certain rights in the invention.

FIELD OF THE INVENTION

The present invention relates to methods for measuring and/or mapping in-plane strain of a surface of a substrate.

BACKGROUND OF THE INVENTION

Electronic devices and packages composed of complex material systems undergo unevenly distributed thermo-mechanical strain during their life cycle because of the mismatch of coefficients of thermal expansion (CTE) among the silicon and different packaging materials, which affects the working performance and reliability of the electronic products. Following the accelerated miniaturization trend, microelectronic packages have been pushed forward to be smaller and smaller in order to meet the demands of the market. The inevitable consequences of miniaturization include increased heat dissipation among layers of different packaging materials, which results in various degrees of deformations in the layers due to a CTE mismatch. The deformation brings in non-uniform distributions of strain across the whole package, where spots experiencing the highest strain are most likely to fail. A localized strain distribution map, coupled with an understanding of the material properties, could be a good indication of the potential reliability failure locations in the package. There is a great need for knowledge of the strain distribution across the package in order to analyze the failure mechanism and consequently to improve the design of the packaging.

The often used strain sensing techniques capable of strain mapping include micro Moiré, optical digital image correlation (DIC), and scanning electron microscope (SEM) DIC, etc. Micro Moiré has been proven to be a highly sensitive, full-field in-plane sensing technique. However, the illuminated area for generating a Moiré pattern needs to be large enough to detect small strains; consequently, it lacks the ability to resolve strains with small spatial variations. DIC techniques can achieve a high spatial resolution with high in-plane displacement resolution. However, the field of view is compromised since a large optical magnification is required, and becomes a limiting factor when detailed strain mapping in a large area is needed.

Therefore, there remains a need for a strain sensing technique to map the in-plane strain distribution with high strain sensitivity, high spatial resolution, and a large field of view.

SUMMARY OF THE INVENTION

The present invention relates to methods for measuring and/or mapping in-plane strain of a surface of a substrate. The present methods fill a technology gap that requires: high strain sensitivity and high spatial resolution while maintaining a large field-of-view. According to the present invention, a grating is formed on at least a portion of the surface of the substrate. The grating may be formed separately and adhere to the surface of the substrate or may be formed directly on the surface itself. Preferably, the grating has a wavelength of about 750 nm to about 850 nm, more preferably about 800 nm to about 850 nm. A laser is then focused onto the grating to determine the strain on the surface by determining the variation of the grating wavelength due to the strain on the surface. The strain information is essentially carried by the grating, in terms of grating wavelength, because it varies according to the volume change of the underlying substrates. The laser spot size is relatively small, about 50 µm to about 200 µm in diameter. By scanning the surface grating with the small laser size, a high resolution strain map of the surface can be produced. The induced strain is related to the grating wavelength variation, which leads to the diffraction angle variation that is captured by the strain sensing measurements.

An apparatus for conducting the strain measurement methods is also provided.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 9C (1) is a contour plot with smaller sample scanning step size, 2 μm, for the highlighted region in FIG. 9B.

FIG. 9C (2) is a contour plot with smaller sample scanning step size, 1 μm, for the highlighted region in FIG. 9B.

FIG. 11A shows a schematic of the fabrication process for a PDMS/Au grating.

DETAILED DESCRIPTION

Figure 1A:
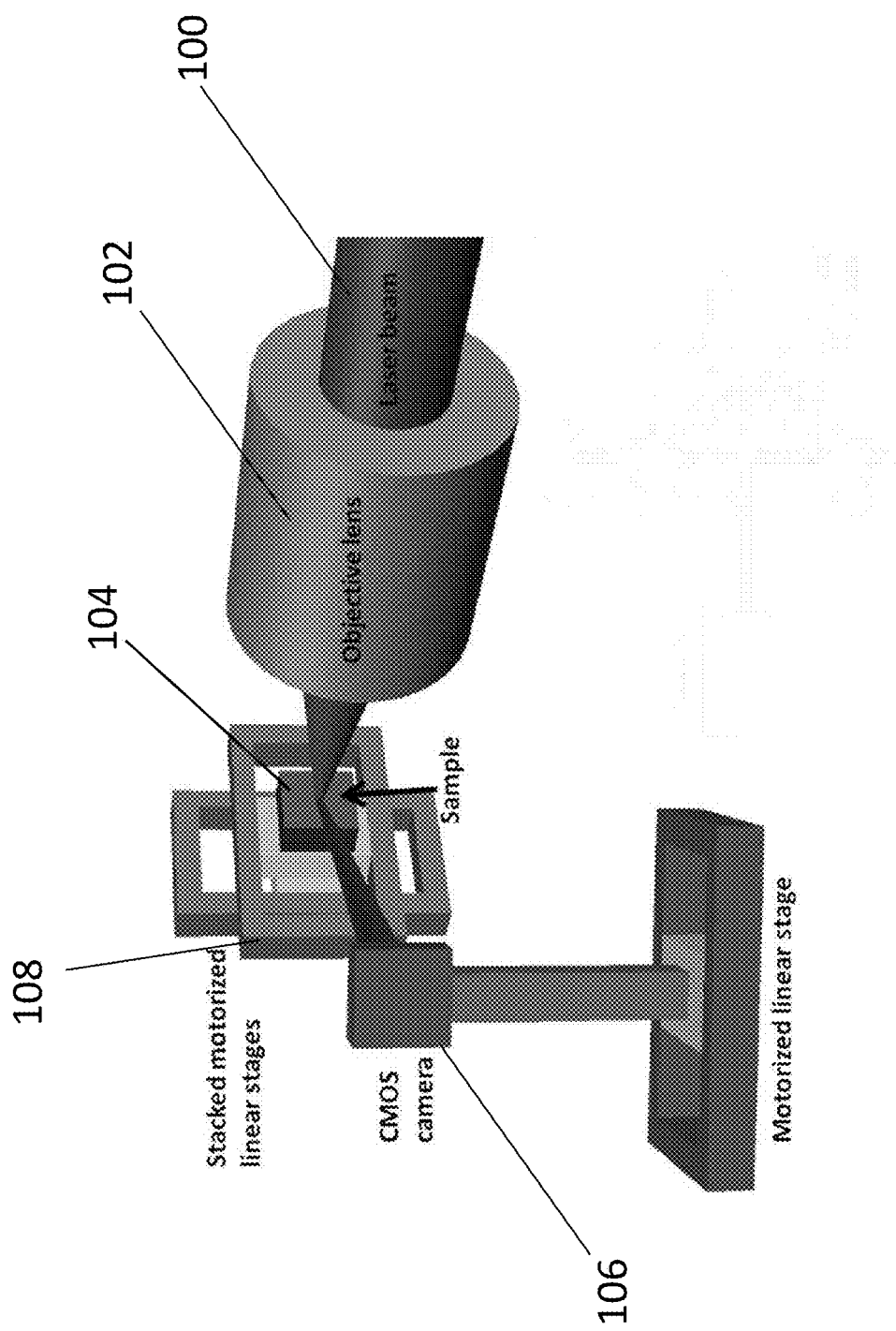
FIG. 1A illustrates an apparatus for measuring and/or mapping in-plane strain of a surface of a substrate.
Figure 1B:
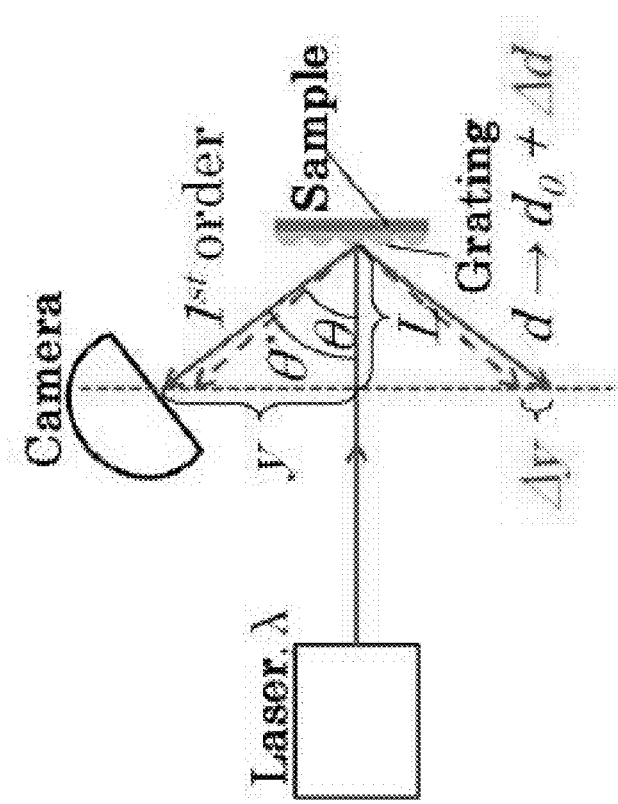
FIG. 1B illustrates a working principle of for measuring and/or mapping in-plane strain of a surface of a substrate.

Referring to FIGS. 1A-B, which shows the working principles for the strain sensing technology of the present invention. The substrate sample 104 with a grating thereon is interrogated by a laser beam 100. The laser beam 100 is focused by an objective lens 102 to reduce the spot size of the beam to the desired size. A camera 106 is positioned to capture the first order diffraction light from the grating. In a preferred embodiment, the sample 104 is mounted on stacked motorized linear stages 108, so that the sample 108 may be moved for surface scanning. Alternative to moving the sample 104, the laser 100 may also be moved to scan the surface.

In operation, a collimated laser beam 100 is focused on the grating which is fabricated onto the target substrate 104. The strain information is carried by the grating, in terms of grating wavelength since it varies according to the volume change of the underlying substrates. The camera 106 is mounted in order to capture the first order diffraction light profile. With continued reference to FIG. 1B, by heating or stretching the grating, the diffraction angle changes due to the grating period variation, denoted as Δd, which is a result of the strain. This leads to a displacement in the peak position of the diffracted light, which is the measured parameter Δy. Two equations are used to derive the relationship between Δy and Δd. They are grating equation, $$d_o \sin \theta = m\lambda,$$

where θ is the diffraction angle, $d_0$ is the initial grating period, and λ is the laser source wavelength, and m is the order of diffraction (m=1 for the first order diffraction); and the geometric relationship between the incident laser spot and the detector position is $$\tan \theta = y/L,$$

where L is the horizontal position of the specimen and y is the vertical position of the photo detector. Combining these two equations gives the relationship between Δy and Δd as follows:

$$\Delta y = -\frac{\lambda L}{d_0^2 \left(1 - \frac{m^2\lambda^2}{d_0^2}\right)^{3/2}} \Delta d = -\frac{\lambda L}{d_0 \left(1 - \frac{m^2\lambda^2}{d_0^2}\right)^{3/2}} \varepsilon = -A\varepsilon.$$

where the strain ($\varepsilon = \Delta d/d_o$) of the substrate sample is related to Δy the pre-factor A. The relationship shows a linear dependency with a magnification factor (A) of as large as $10^6$, when the proper initial values are chosen for λ, $d_o$ and L. For example, for the present invention, the laser wavelength λ and grating period d are in the order of micrometers, while y and L are on the order of tens of centimeters, preferably about 10 to about 15 centimeters. Therefore the optical setup is designed to amplify the nanoscale change of the grating period by almost six orders of magnitude into a diffraction peak shifting on the order of several millimeters on the detector side. This significantly amplifies the small displacement on the grating fabricated on the sample so that the desired sensitivity and accuracy is achieved.

The grating may be formed over the entire surface to be measured or on selected portions of the surface. Preferably, the grating is formed on selected areas or a surface having dimensions of about 1 mm×about 200 µm. The selected areas could be, for example, areas of high strain such as at the interface of two different materials. The grating has an initial period in the range of micrometers, preferably about 750 nm to about 850 nm, more preferably about 800 nm to about 850 nm, most preferably about 800 nm. In certain embodiments the initial period may be variable or constant. In any event, the initial period of the grating is known and predetermined.

The grating may be formed directly on the substrate or formed separately and adhered to the surface of the substrate. Preferably, the grating is formed directly on the substrate, for example, by either soft contact lithography or electron beam lithography (EBL). Soft contact lithography is well-known in the art and involves the use of a polymeric (e.g., PDMS) mask which is used on the substrate to transfer the grating pattern onto the substrate's surface through the photolithography process. Soft lithography methods disclosed, for example, in U.S. Patent Application Publication No. 2003/0006527, may be appropriate for the present invention.

EBL is well-known in the art and is a maskless form of lithography accomplished by scanning a focused electron beam onto the surface of the substrate to draw the grating pattern. The surface is typically covered with a resist whose solubility is changed by the electron beam. The exposed or non-exposed regions of the resist can be removed by immersing it in a developing solvent. EBL methods disclosed, for example, in U.S. Pat. No. 6,635,884, may be appropriate for the present invention.

A laser beam is used to scan the grating on the substrate. Preferably, the beam from the laser source is passed through an objective lens to focus the laser to a small spot size of about 1 µm to about 200 µm more preferably 50 µm to about 200 µm or about 1 µm to about 10 µm at the grating. That small spot size allows for the high resolution of the present method. It is preferable to utilize a single mode laser with an output power of at least about 20 mW.

Any strain on the surface of the substrate results in a change in diffraction pattern which is detected, for example, by a camera, such as a CMOS camera. The sensing element of the camera is preferably at least 1 inch wide; the pixel size of the camera is preferable to be about 5 µm×5 µm. For the present invention, preferably, the first order diffraction is detected by the camera. Any change in the first order diffraction pattern is then compared to a standard curve to determine a strain at that spot on the grating. To render a strain map of the grating surface, the laser is used to scan the surface. When the spots are integrated over the surface, a high resolution strain map of the surface can be produced. The diffraction pattern may be detected by a camera, such as a CMOS camera.

Without further description, it is believed that one of ordinary skill in the art can, using the preceding description and the following illustrative examples, make and utilize the present invention and practice the claimed methods. The following examples are given to illustrate the present invention. It should be understood that the invention is not to be limited to the specific conditions or details described in the examples.

Example 1—Demonstration of Strain Sensing Using Laser Scanning Technique: Strain Sensitivity and Spatial Resolution The spatial resolution is studied using a specially designed grating pattern on a polished silicon substrate made with electron beam lithography (EBL) in this work. Alternatively, for a large area, sub-micron periodic grating structure, soft material contact lithography can be used. The grating wavelength is spatially varied on the substrate to model the strain distribution, where the strain is defined as $\Delta d/d_o$. By scanning the laser beam across the whole grating pattern, one can obtain the grating wavelength d versus the laser spot's position on the sample. By comparing the extracted grating wavelength distribution from the experiment with the original design, one can study the spatial resolution and accuracy of the strain sensing. The strain sensitivity is validated by extracting the coefficient of thermal expansion from silicon.

Figure 2:
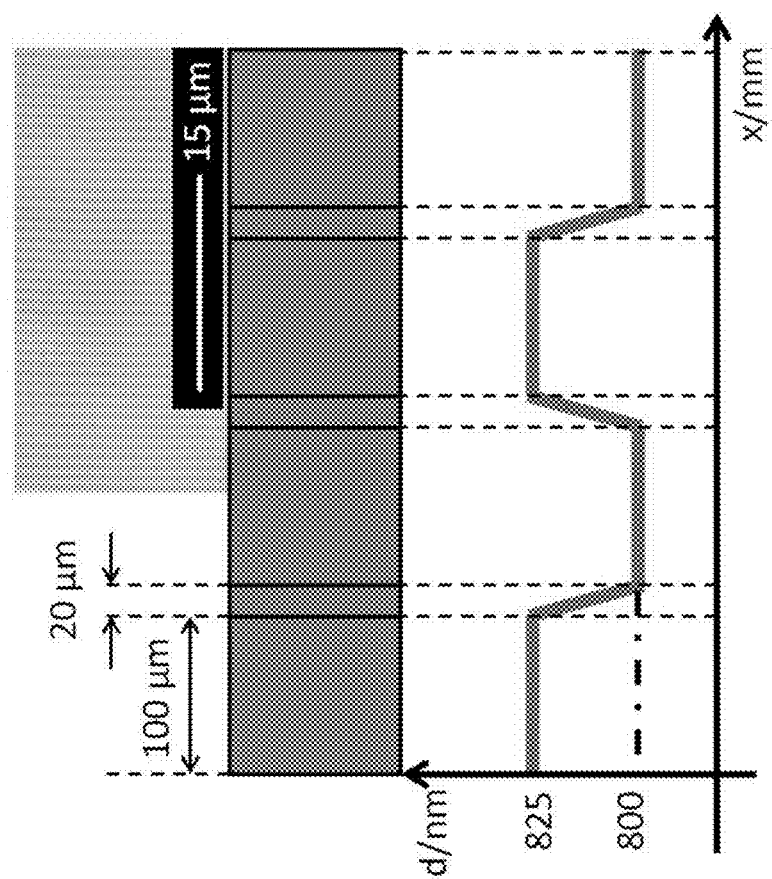
FIG. 2 shows the design of the EBL pattern (schematic) and an optical image of the grating (top right corner with scale bar).

The EBL defined pattern, shown in FIG. 2 is designed to mimic the strain distribution across composite structures, such as SU-8/Si strips, with an exaggerated strain variation (around 3% difference in grating wavelength). The pattern is assembled with multiple domains, covered with a grating of constant wavelength or a gradient of wavelengths. The domains covered with a gradient of gratings are defined to be around 20 m wide, while domains covered with a constant grating are defined to be 100 µm wide. From the left side of the pattern, as shown in FIG. 2, the grating wavelength d starts at 825 nm. After the $1^{st}$ 100 µm wide domain, it ramps down gradually to 800 nm over a 20 µm wide area, and remains at the 800 nm wavelength for the following 100 µm domain. It then ramps back up to 825 nm and repeats the previous patterns. The whole grating pattern has a width of 460 µm and a length of 100 µm. The optical image of the grating shows the high quality of the EBL defined grating pattern. Since the designed grating wavelength variation is so small, one can hardly observe the grating wavelength change through a microscope even at 1000× magnification. The gradient strain distribution is expected at the interface of the two materials with mismatched CTEs, which is why a gradient grating is incorporated in the pattern. Although the strain gradient can be large and sharp at the interface of two materials in real cases, it is designed to be a much smoother gradient in the EBL pattern for simplified modeling.

Figure 3:
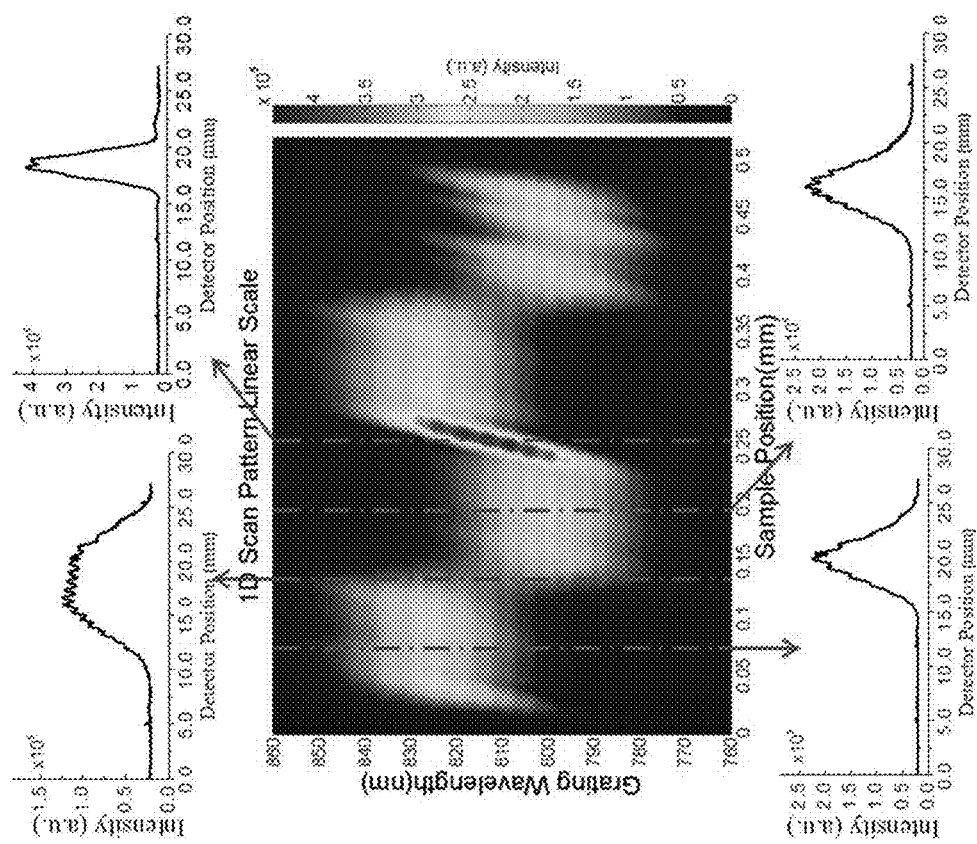
FIG. 3 demonstrates the strain mapping on an EBL defined gratings on Si substrate. Four plots of diffraction light profiles at four individual sample positions are displayed around the contour plot.

The one-dimensional scan was performed with a sample stage step size of 2 µm and a scanning distance of 520 µm, which was sufficient to scan across the whole pattern. The laser spot size on the grating surface is ~50 µm in diameter, which is smaller than the width of domains covered by the 100 µm constant grating pattern. The results are plotted in the contour plot as shown in FIG. 3 with a linear scale and in FIG. 4 with a log scale of the diffracted light intensity. For each sample position, the camera captured the profile of the $1^{st}$ order diffraction profile, which is the combination of Gaussian peaks from the illuminated domains. It is plotted as a column for the corresponding sample position in the contour plot, where the diffracted light intensity can be seen in the varying signal intensity. Four plots of the diffraction light profile are displayed in FIG. 3, with enlarged images of the individual scan profiles at four positions. Scanning the sample gives a series of columns containing the diffraction light profile. The contour plot is formed by stitching these columns together. The y-axis of the contour plot displays the grating wavelength, which is calculated from the peak position of the diffracted beam from the camera side. From the contour plot, one observes that the diffraction peaks from 800 nm and 825 nm grating patterns are well separated at the camera side. The diffraction light intensities from all the constant grating domains are at a relatively stable level. The size of the domains with constant grating patterns are observed to be around 100 μm wide, however, the gradient domains between the constant domains turned out to be larger than the designed width of 20 μm. This is because the gradient domain areas are partially overlapping with the constant domains. In addition, an asymmetry is observed for the upwards and downwards transient domains, in terms of the light intensity and the width of the diffraction light profile. The next step is to extract the grating wavelength from the strongest peak at each sample position.

Figure 4:
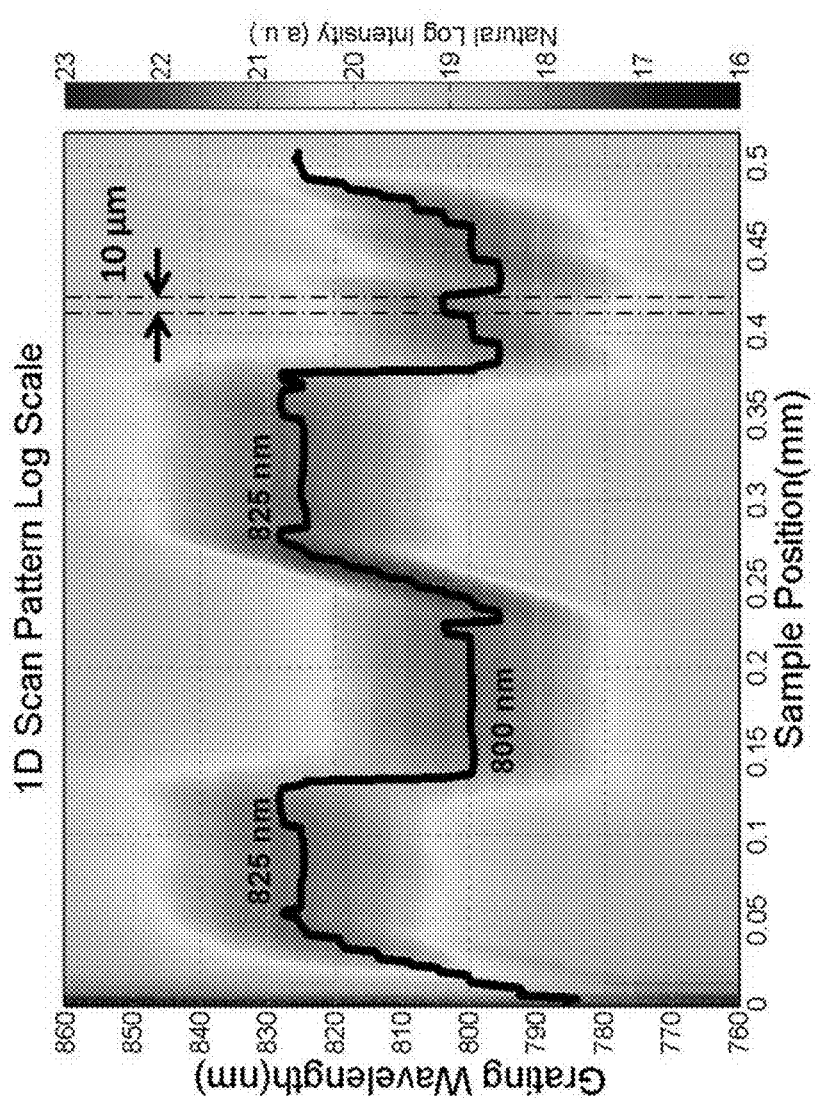
FIG. 4 shows contour plot of 1D scan results across the EBL defined pattern using a log scale, superimposed with the extracted grating wavelength from the contour plot.

As displayed in FIG. 4, the extracted grating wavelength is plotted versus sample position as the black curve. It is superimposed onto the 1D contour plot which has a light intensity displayed in a log scale. The extracted grating wavelengths from the 100 μm wide domains are 800 nm and 825 nm periodically, which is in agreement with the designed values. However, the flat region shows the constant grating wavelength is around 80 μm wide, narrower than the actual domain size. At the interfaces of the different domains, the grating wavelength shifts exhibit certain tendencies. The transition from 825 nm to 800 nm has a steeper slope compared to the transition from 800 nm to 825 nm. This is dependent on the laser spot size and the initial distance between the camera and the sample. This can be compensated by adding corrections to the scanning results after further investigation of this effect.

Figure 5A:
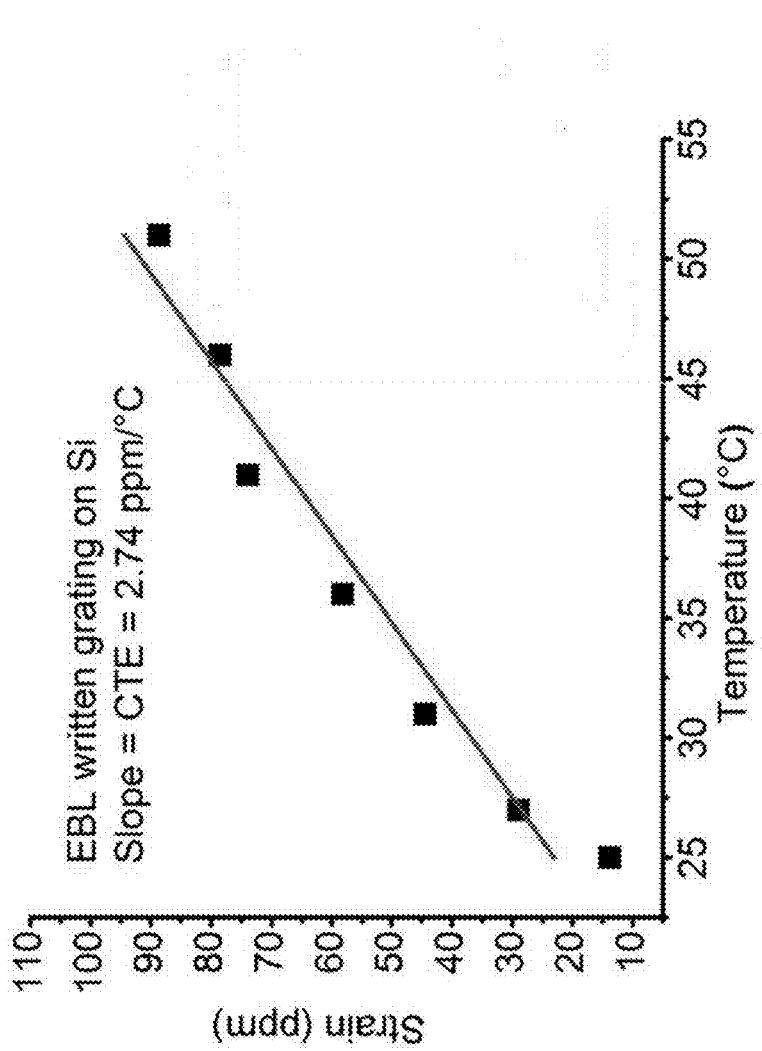
FIG. 5A shows CTE extraction from the thermal measurement on a Si substrate covered with an EBL written grating.
Figure 5B:
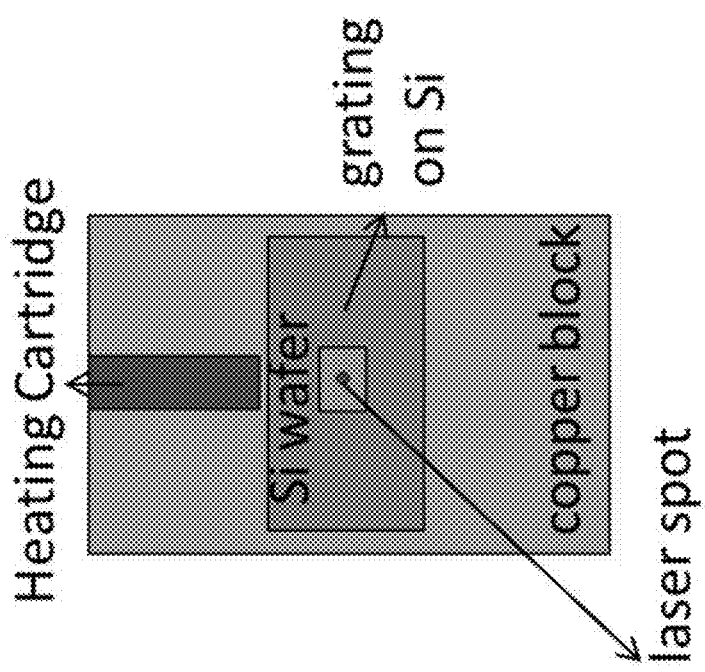
FIG. 5B shows the schematic of the thermal measurement setup.
Figure 6:
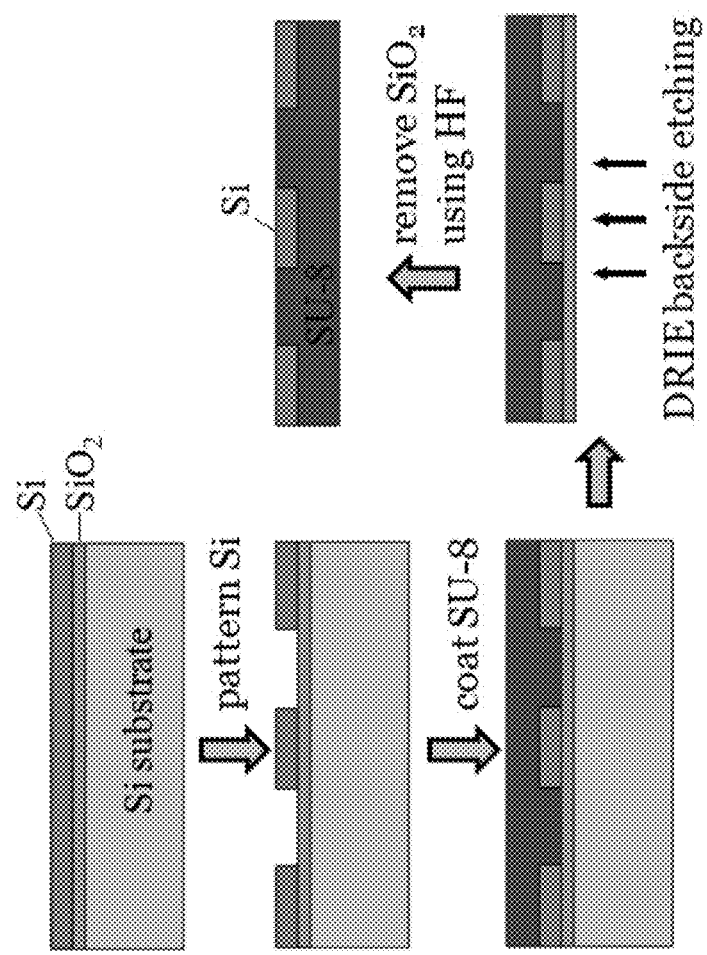
FIG. 6 shows the fabrication process for the SU-8/Si junction.

The fourth constant domain from the left side of the pattern displays imperfections in the grating pattern. The grating wavelength variation from the imperfect spots is only a few nanometers, which is barely noticeable with a high magnification optical microscope. On the other hand, it is highly pronounced from the results produced by the laser scanning technique. As marked on FIG. 4, the smallest resolvable feature size verified by the scanning results is 10 μm, which indicates its spatial resolution of 10 μm when applying a much larger laser spot size of 50 μm in diameter In order to verify the strain sensitivity for a zero-thickness grating, (where the grating is directly fabricated onto the substrate without applying an additional adhesive layer,) on the target substrate, elevated temperature measurements were taken on a Si substrate that contained EBL defined grating patterns. The Si sample was mounted on a copper block which could be heated by inserting heating cartridges. The temperature was ramped from 25° C. to ~50° C. At each temperature, a scan was performed at the camera side to record the profile of the diffraction signal. The peak position extracted from the diffraction light profile was utilized to calculate the grating period, $d=d_o+\Delta d$. Consequently, the strain was calculated as $\Delta d/d_o$ and is displayed on the y-axis in FIG. 5. Then the CTE of Si was extracted from the slope to be 2.74 ppm/° C., which matches the reference value of 2.6 ppm/° C. The small strain measured from the silicon sample is on the order of 10 micro-strain scale, and thus demonstrates the high strain sensitivity of this technique.

Figure 7A:
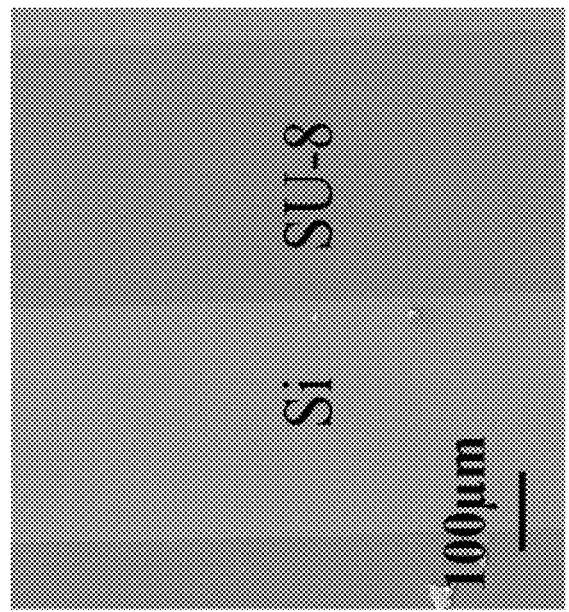
FIG. 7A illustrates the SEM image of SU-8/Si junction.
Figure 7B:
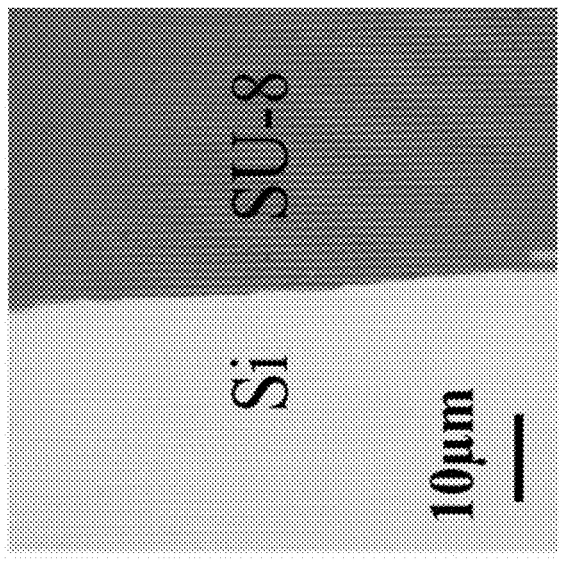
FIG. 7B illustrates the optical image of the gratings written on SU-8/Si junction using EBL.

Example 2—Fabrication and Finite Element Analysis (FEA) of a Planarized Junction of SU-8/Si In order to obtain the strain information at the junction of two dissimilar materials with different CTEs upon thermal loading, we fabricated a globally planarized junction composed of SU-8/Si. The fabrication of the SU-8/Si starts from a silicon on insulator (SOI) wafer. The top silicon layer is 10-20 μm thick and is patterned into silicon strips using a standard lithography process. The width of the silicon strips and the spacing are in the range of tens of microns to several hundreds of microns. Then an SU-8 layer is spin-coated on top to fill in the trenches completely. After hard-baking the SU-8 layer, deep reactive ion etching (DRIE) is used to etch the silicon substrate from the backside until the $SiO_2$ etch stop layer, which is then removed at the subsequent step using hydrofluoric acid (HF). FIG. 7A shows the scanning electron microscopy (SEM) image of a SU-8/Si junction, and FIG. 7B shows the optical image of a grating on the SU-8/Si junction fabricated with EBL. The optical image doesn't focus well for the upper-right-hand corner area since the junction surface is not perfectly flat and exhibits slight amounts of warping induced by the fabrication process.

We should point out that this silicon surface is coming from the unpolished side of the device layer and is relatively rough compared to the polished silicon surface. As a result, the rough surface can abate the reflection of the laser light. Also, the sidewalls of the silicon strips are relatively deep (>10 μm) and therefore are neither vertical nor perfectly smooth due to isotropic dry etching. After filling with the SU-8 and baking it is possible that cracks or delamination at the interface of the sidewalls are present due to the large CTE mismatch between SU-8 and Si.

Figure 8A:
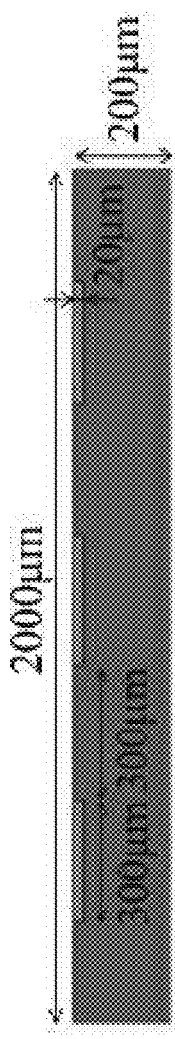
FIG. 8A shows a schematic of the SU-8/Si junction structure.

The commercial finite element package ABAQUS is used to simulate the thermal deformation of the junction structure of SU-8/Si when subjected to temperature changes. FIG. 8A shows the model, including three 300-μm-width by 20-μm-thick silicon strips embedded in a 200-μm-thick by 2000-μm-long SU-8 substrate with 300 μm spacing between the strips. The thermal strain analysis is conducted by introducing a uniform temperature change ΔT in the whole domain. The silicon and SU-8 are modeled by a 4-node bilinear plane strain element (CPE4) for two different cases. In case one, the ideal bonding, the SU-8/Si interface is treated as shared nodes which indicates the perfect bonding between the silicon strips and the SU-8 substrate on both the bottom and the two sides. In the latter case, the weak bonding case, the silicon strips are connected to the SU-8 substrate only through the bottom using TIE constraint and there is no bonding with the SU-8 on the two sides of each silicon strip. The weak bonding case is used to simulate a scenario when the bonding is less than ideal and there is delamination on the two sides. The following material parameters are used in the analysis: $E_{SU-8}=2$ GPa, $v_{SU-8}=0.3$, $\alpha_{SU-8}=52\times10^{-6}/°$ C., $E_{Si}=130$ GPa, $v_{Si}=0.3$, $\alpha_{Si}=2.6\times10^{-6}/°$ C., $\Delta T=45°$ C., where E, v and α are Young's modulus, Poisson's ratio and the CTE, respectively. We assume that the surface is ideally flat and there is no warpage existing.

Figure 8B:
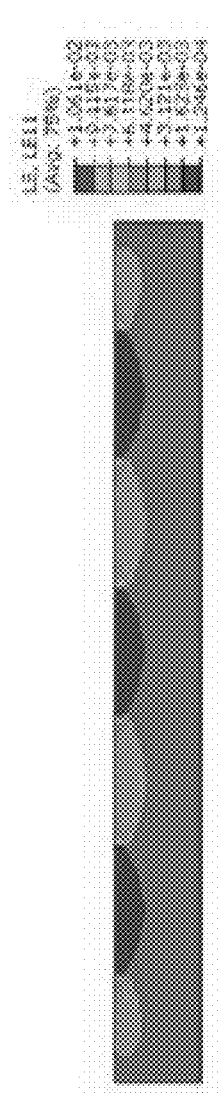
FIG. 8B illustrates strain contours in the horizontal direction on the surface for the ideal bonding case.
Figure 8C:
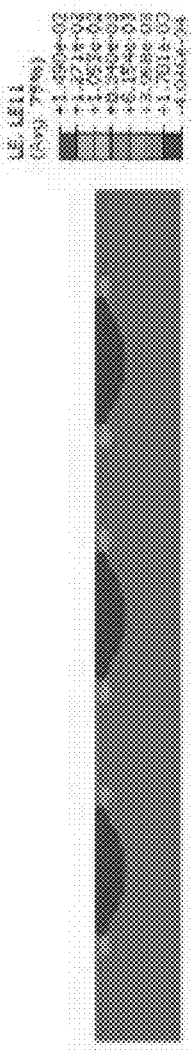
FIG. 8C illustrates strain contours in the horizontal direction on the surface for the weak bonding case.
Figure 8D:
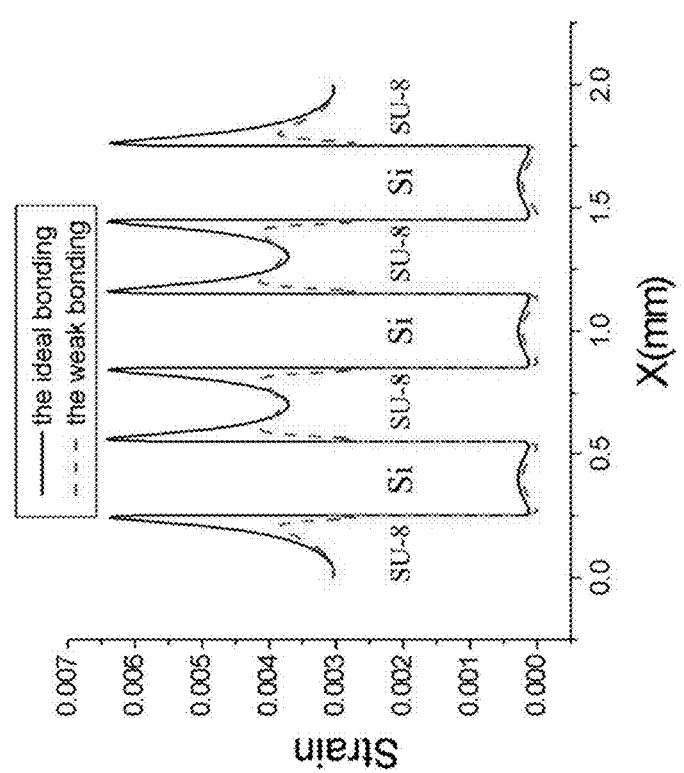
FIG. 8D is a graphical illustration of strain as a function of the horizontal distance on the top surface of structure. The temperature change ΔT is 45° C.

Strain contours in the horizontal direction on the top surface of the structure are shown in FIG. 8B for the ideal bonding case and in FIG. 8C for the weak bonding case. FIG. 8D shows the strain as a function of horizontal distance on the top surface of the junction structure for the two cases. The strain on the SU-8 area is much higher than that of the silicon strips and when subjected to a temperature change of 45° C., the junction experiences a sudden strain change due to the CTE mismatch. The strain on the silicon surface fluctuates slightly and the two ranges are at the same level for both cases: $1.3\times10^{-4}$~$2.9\times10^{-4}$ for the ideal bonding case and $8\times10^{-6}$~$2.3\times10^{-4}$ for the weak bonding case. But the strain ranges differ greatly on the surface of SU-8, ranging from $3.7\times10^{-3}$ to $6.4\times10^{-3}$ while exhibiting very sharp peaks for the ideal bonding case. However, in the weak bonding case, the strain ranges from $3.8\times10^{-3}$ to $4.1\times10^{-3}$ while exhibiting blunt peaks. This is reasonable since the surface of the SU-8 pattern has more constraints on the two sides from the silicon strips while under thermo-mechanical loading, and therefore has a steeper strain gradient across the SU-8 surface along with a sharp strain jump on the edges for the ideal bonding case.

Example 3—Strain Mapping on SU-8/Si Composite Sample

Electronic packages are typically integrated with various different materials with a mismatched CTE, which leads to a complicated distribution of strain across the whole package. To evaluate the applicability of this laser scanning technique for strain mapping, we tested a composite sample as described in the preceding section to model a simplified case of strain distribution. The results were compared with thermal strain distributions calculated by FEA for a similar sample structure. The comparison between the measurement and simulation results evaluates the feasibility of applying this laser scanning technique towards advanced applications of electronic packages.

We first fabricated a uniform grating structure with an 800 nm wavelength across consecutive SU-8/Si strip samples using EBL and metal lift-off techniques. Ideally, for a uniform material, the grating wavelength will not change across the sample. After heating the composite sample made of CTE mismatched materials, such as SU-8/Si strips as we fabricated and discussed above, the sample will experience unevenly distributed thermal strain depending on the thermal expansion from the underlying substrates and the constraints from the surrounding materials. By measuring the degree of expansion at the surface, one can map the strain distribution on the composite sample. The grating pattern fabricated onto the composite sample contracts and expands to follow the expansion of the underlying substrate, and thus, records the strain information. By spatially scanning the sample with a small laser spot size, the grating wavelength variation is captured by the camera as a shift in the diffraction peak position, which can be translated back into strain information through data processing. Thus, the SU-8/Si composite samples that were fabricated with a grating were tested to validate the capability of this strain sensing technique.

Figure 9A:
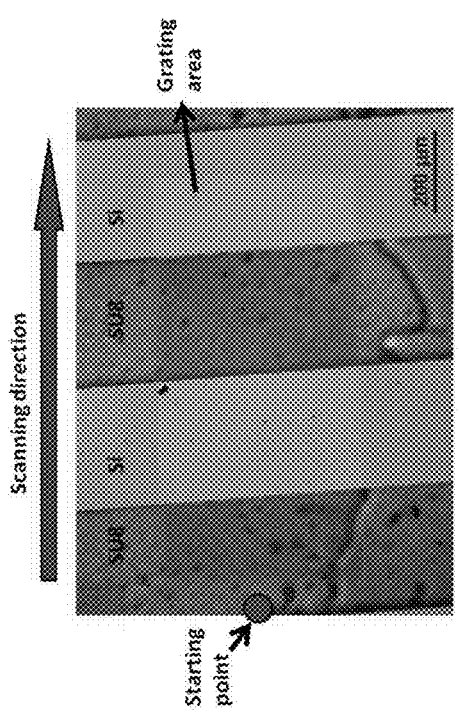
FIG. 9A shows an optical image of the grating area on the SU-8/Si substrate, marked with the scanning area and direction.
Figure 9B:
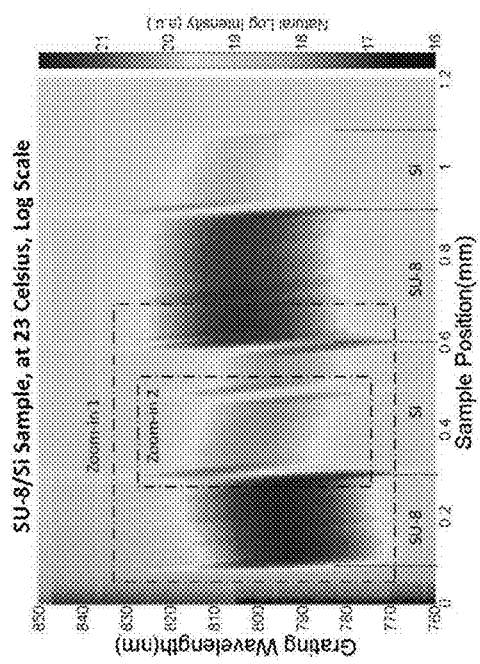
FIG. 9B illustrates a contour plot of the 1D scan across the SU-8/Si composite structure, using a linear scale.
Figure 9D:
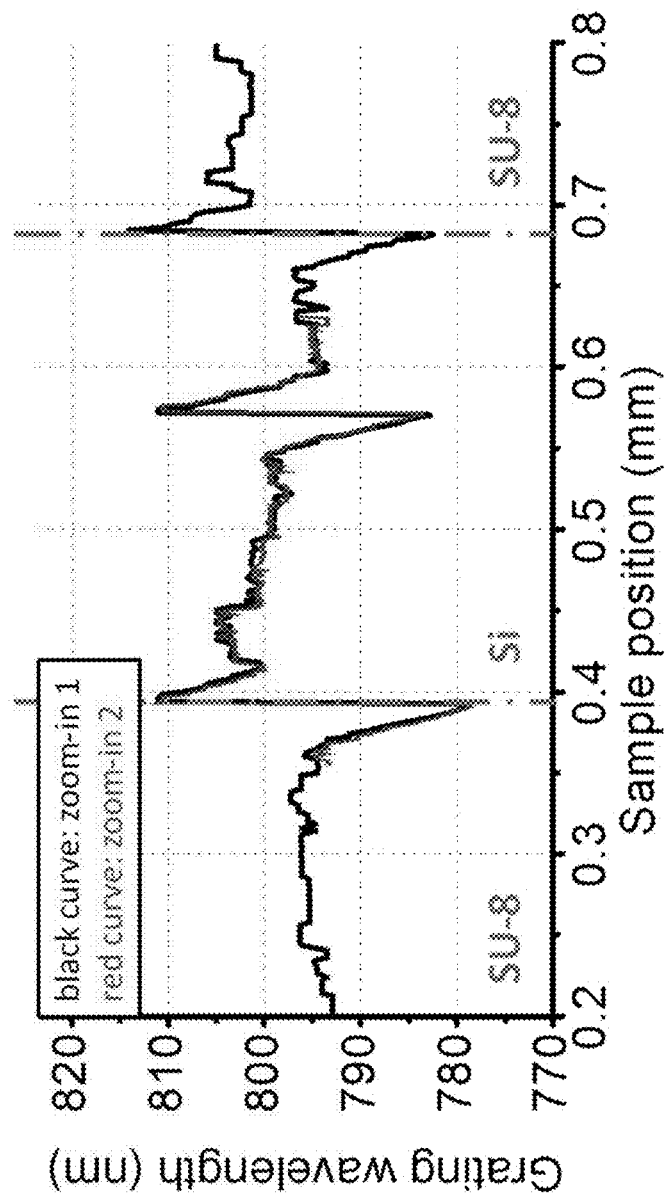
FIG. 9D illustrate superimposed plots of the extracted grating wavelength versus sample position from the contour plots in FIGS. 9C (1) and 9C (2).

FIG. 9A shows the optical image of one grating pattern fabricated onto the SU-8/Si composite sample. The whole grating pattern covers an area of 1 mm by 0.5 mm. As observed from the optical image, the grating lines are not perfectly aligned with the SU-8/Si strips, which affects the captured diffraction light signal when the laser is shining on the interface of the two different strips. Observing the high magnification optical image of the grating area confirms that the grating quality of the Si strips is not as good as the grating on the SU-8 strips. This is likely caused by the EBL lithography process that involves developing and lift-off in solutions that can distort the 300 μm thick SU-8 sample. The other direct observation from the optical image is that the whole SU-8/Si composite sample is not flat after fabrication with the EBL defined grating pattern, which can be the result of a non-flat surface from the epoxy that was used to attach the thin sample to the sample stage. In addition, the sample exhibits warping due to the thermal heating and immersion in acetone during the fabrication process of making the gold grating patterns. Therefore even at room temperature, the grating wavelength does not appear to be at a constant 800 nm across the entire pattern, even though the original intention was to design a uniform grating pattern. This can be seen in the contour plots for measurement results in FIGS. 9B, 9C (1), 9C (2), and 9D. However, this non-uniform strain observed from the sample illustrates the power of this laser scanning technique which can delineate strain variation at a very high spatial resolution.

The laser beam was scanned across the whole grating region by increments of 5 μm, as demonstrated in FIG. 9A with the scanning area and scanning direction at room temperature (23° C.). The testing results are depicted on the contour plot in FIG. 9B. The diffraction light intensity from the SU-8 substrate is indeed stronger than the signal from the Si substrate, which is likely due to the wavering quality of grating patterns on those regions: the SU-8 surface is smoother than the unpolished side of the Si surface from the original SOI wafer. At room temperature, the extracted grating wavelength already appears to show small amounts of variances versus the laser spot position. The information recorded from the room temperature scan is a combination of factors that alter the diffraction angle from the grating pattern. Some of the factors can be explained, while others cannot be fully interpreted using the current system setup.

In order to verify the repeatability of the recorded grating wavelength variation, two additional 1D scans with smaller step sizes were conducted at the same temperature, which also shows more detailed information. Both scans displayed in FIGS. 9C (1) and 9C (2), cover the Si region where there is a discontinuity in the grating pattern which comes from a noticeable imperfection in the grating pattern. By superimposing the extracted grating wavelength versus sample position plots from the two zoom-in scans, one observes that the three small steps within the silicon region repeats themselves in those two independent measurements. The height of the steps is also about 2~4 nm, which confirms that it is a signal coming from the sample instead of random noise. Note that the previous CTE extraction of silicon sample validates that even a 10 micro-strain is detectable from this laser scanning technique. The dimension of the steps is between 20-30 μm. This indicates that the resolvable feature size from the laser scanning technique is at least 20 μm, thus demonstrating the spatial resolution. One strategy to improve the spatial resolution is to further reduce the laser spot size. Hence, with a sufficient number of sample steps and fine step sizes along with a proper laser spot size, one should be able to compose a comprehensive and accurate strain map.

Figure 10A:
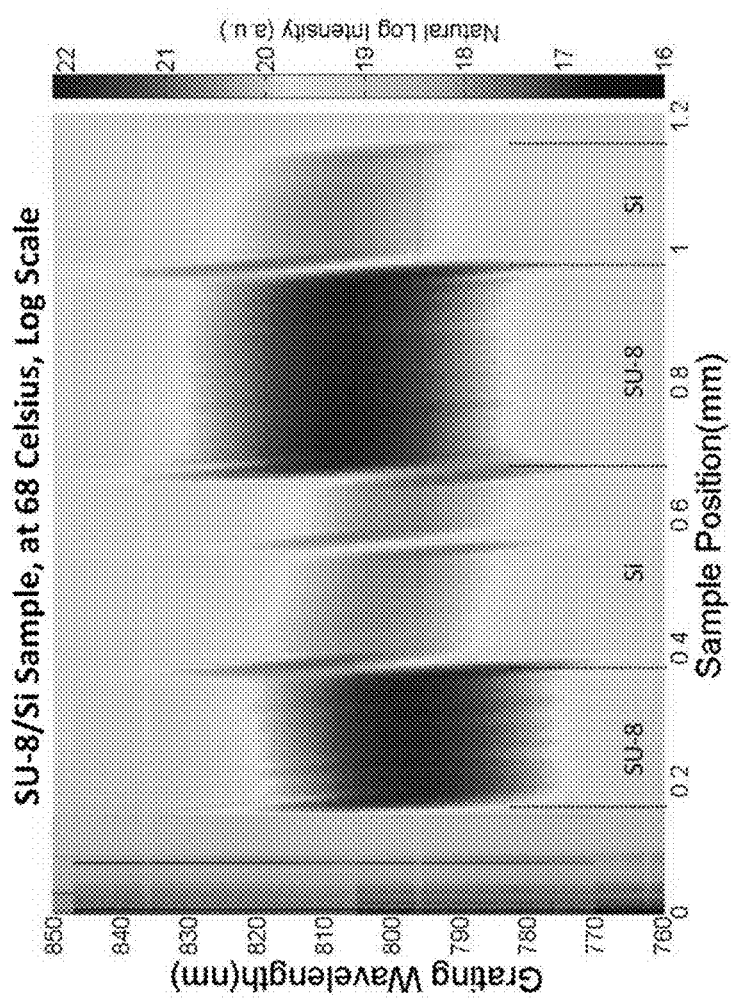
FIG. 10A shows a contour plot of SU-8/Si composite sample at 68° C.
Figure 10B:
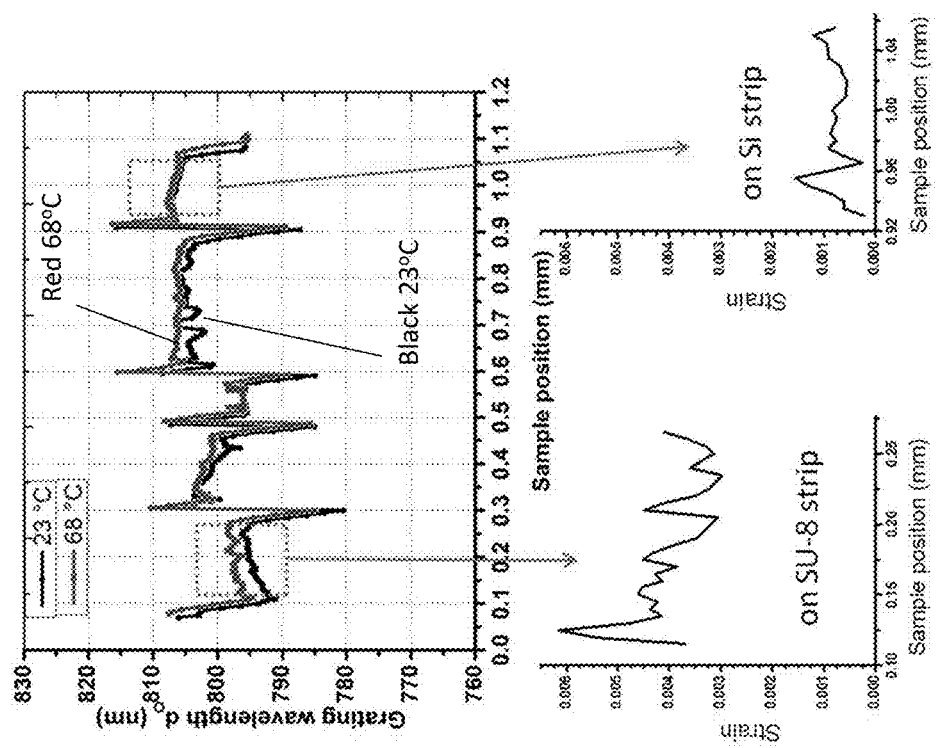
FIG. 10B illustrates the corresponding extracted grating wavelength plotted as red curve, while the extracted grating wavelength at 23° C. is plotted as the black curve. Strain is calculated for SU-8 and Si regions, based on the difference between the two temperatures.

The same pattern has been scanned at an elevated temperature of 68° C. to examine the thermal strain and its spatial variation. The results are plotted in FIG. 10A as a contour plot. The diffraction signal shifts up, which indicates that the grating periodicity increases as a result of thermal expansion. The whole pattern exhibits a lateral shift as well, which is caused by the thermal drift in the sample. Quantitative comparison is performed by superimposing the plots of the extracted grating wavelength versus sample position under two different temperatures, which can be seen in FIG. 10B. The SU-8 region expands more under thermal loading than the Si regions, which is consistent with the simulation predictions. Something interesting is that the width of the heated up pattern is wider than the width of the pattern before heating. Therefore, compensations have been applied for the calculation of the grating wavelength difference, but are not displayed in the grating wavelength versus sample position plot in FIG. 10B. The strain distributions within the highlighted regions are plotted. From left to right on the SU-8 strip, the strain varies between $6\times10^{-3}$ and $3\times10^{-3}$. On the Si strip, the strain variation is between $6 \times 10^{-4}$ and $1 \times 10^{-3}$. The experimental results from the SU-8 region are slightly smaller than the FEA predictions while the experimental results from Si region are larger than the finite element simulations. However, comparing the experimental results between the different regions matches the simulation work.

Strain distribution analysis is not done on the middle region. That is because the strain information in these regions is dominated by other effects, such as warping and imperfections on the grating patterns. Although these factors may impact the regions where analysis is done, they are minor effects compared to the effects discussed in the FEA work.

Example 4—PDMS/Au Grating

FIG. 11A illustrates the fabrication flow of the PDMS/Au grating. A polydimethylsiloxane (PDMS) elastomer (Sylgard 184, Dow Corning) was made by mixing the base component and the curing agent in a 10:1 ratio by weight, followed by de-gassing and curing at 80° C. for 3 hours. A slab of PDMS elastomer (0.1-1 mm thick) was mounted and elastically stretched by a home-made stage with designed uniaxial pre-strain. After being exposed to oxygen plasma (50 W) for 1 minute to enhance the adhesion, the pre-strained PDMS slab was sputter-coated with a gold (90%)/palladium (10%) (Au/Pd) alloy film of nanoscale thickness. The addition of palladium to gold increases its bonding strength, known as white gold. Due to the small proportion of palladium we will refer to the alloy as gold. Finally, the relaxation of the pre-strain in the PDMS substrates compresses the Au thin film, leading to the deformation and wrinkling in both the Au film and PDMS substrate surface in a sinusoidal pattern. This is a result of the minimization of the system's potential energy by the out-of-plane deformation. The wrinkling period, d, is determined by the mechanical properties of Au film and PDMS substrate, the pre-strain $\varepsilon_{pre}$, and the thickness of the gold film.

Figure 11B:
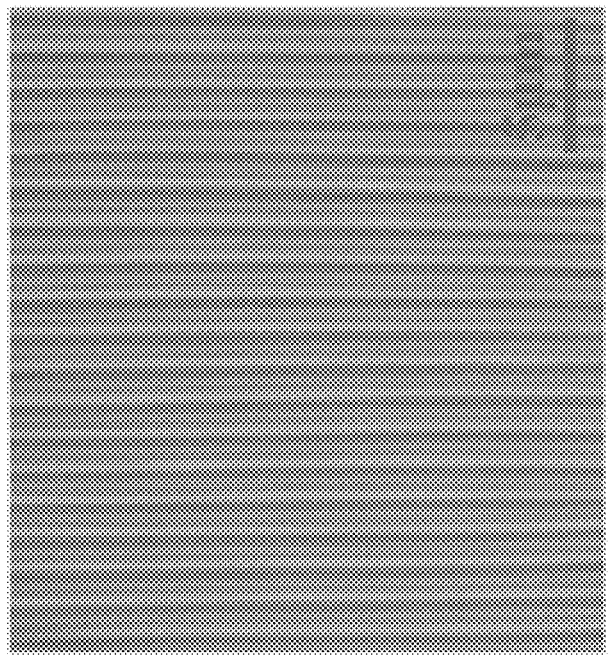
FIG. 11B is an optical microscopy image of a wrinkling profile of PDMS/Au grating surface.
Figure 11C:
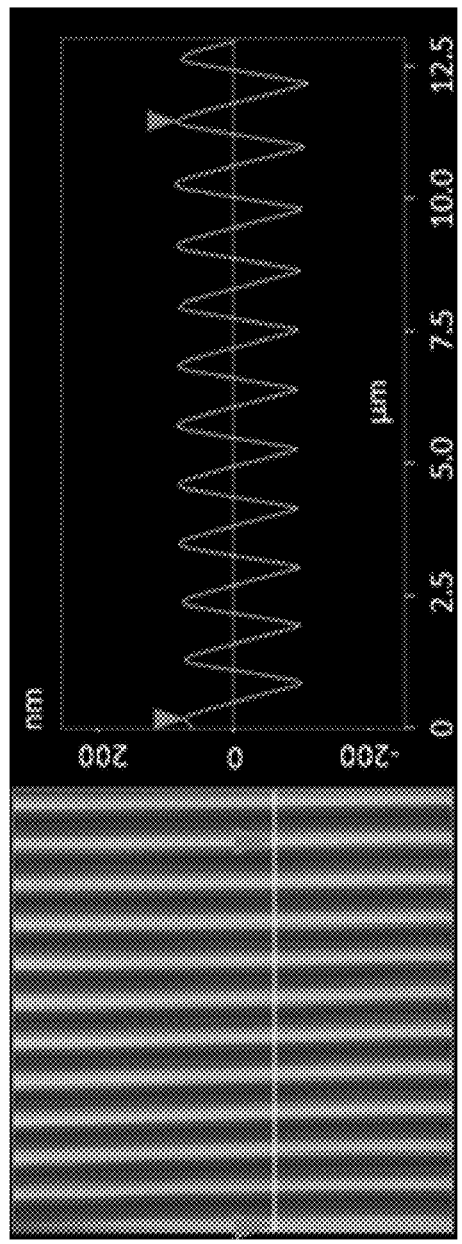
FIG. 11C is an Atomic Force Microscopy (AFM) image of a wrinkling profile of PDMS/Au grating surface.
Figures 11D, 11E:
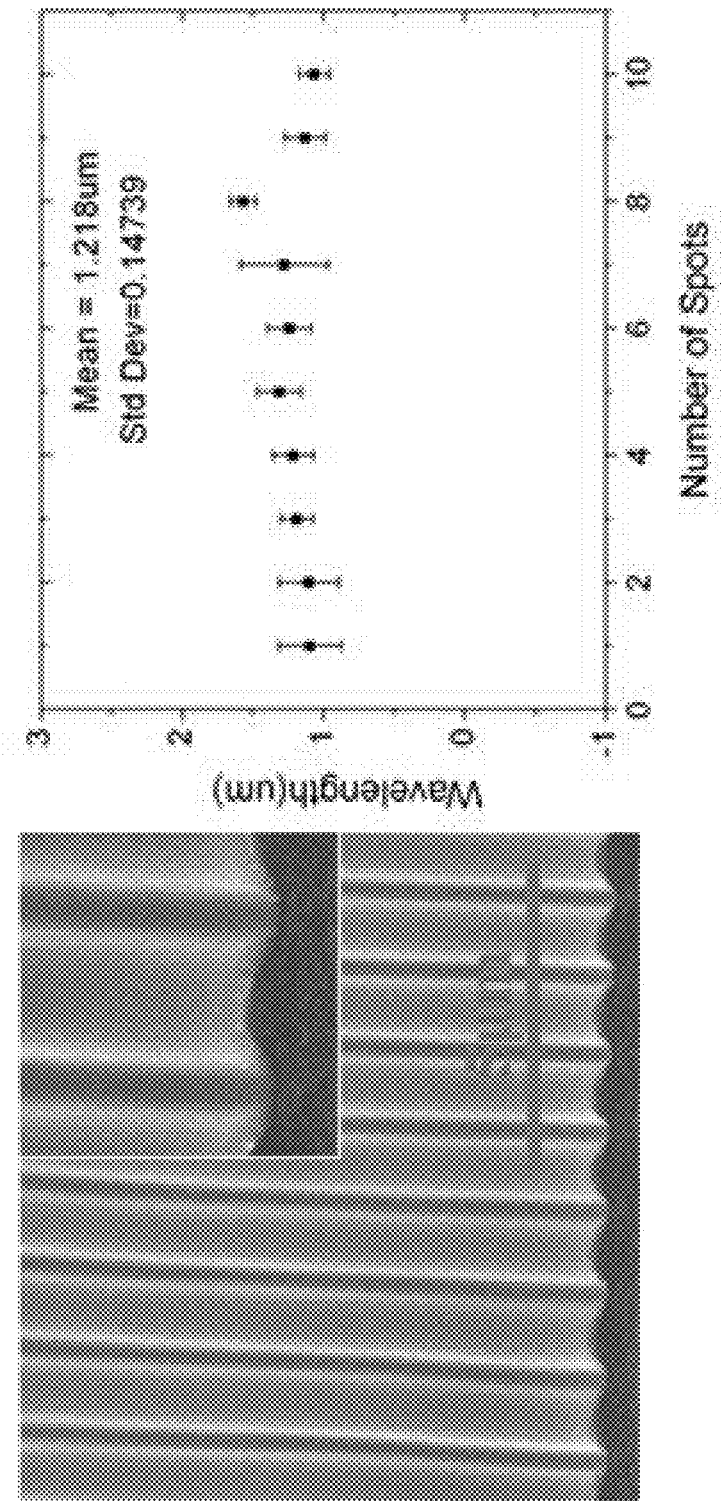
FIG. 11D is a Scanning Electron Microscopy (SEM) image of wrinkles.
FIG. 11E illustrates a wrinkling wavelength (period) distribution at ten different spots over a surface area of 100×100 μm². The wrinkling period remains largely constant over this surface area, in good agreement with the calculated period value by Eq. (1). The error bars are one standard deviation of the data, which is taken as the experimental uncertainty of the measurement.

FIG. 11B shows an optical microscopy image of a PDMS/Au grating fabricated by the above mentioned method, with $h_f=10$ nm, $\varepsilon_{pre}=15\%$, and the measured buckling period $d=1.22$ μm, which agrees well with the calculated value of 1.20 μm obtained from Eq. (1)

$$d = \frac{2\pi h_f}{(1+\varepsilon_{pre})\left[1+\frac{5}{32}\varepsilon_{pre}(1+\varepsilon_{pre})\right]^{1/3}} \left[\frac{E_f(1-v_s^2)}{3E_s(1-v_f^2)}\right]^{1/3}. \quad (1)$$

when the following material parameters are used, $E_f=80$ GPa, $E_s=2$ MPa, $h_f=10$ nm, $v_f=0.3$, and $v_s=0.4921$. FIG. 11C shows the atomic force microscopy (AFM) image of the grating topography and a line-scan profile, which illustrates the uniformity of the buckling in a small area. FIG. 11D illustrates scanning electron microscopy (SEM) image of the continuous gold film along wave direction on PDMS. To examine the uniformity over a large area, the buckling periods were measured at ten different locations on an area of $100 \times 100$ μm² and the results are shown in FIG. 11E. It was found that the buckling period is uniform over a large area.

FIG. 1A illustrates the optical setup used in the microstrain sensing. The light source was a 633 nm He—Ne laser with output power of 21 mW. The laser spot size had been reduced from 700 μm ($\Phi_1$) to 200 μm ($\Phi_2$) in diameter at the grating surface through the use of two optical lenses. In order to improve the signal to noise ratio, an optical chopper was placed before the series of optical lenses to synchronize with the optical detector. A 50/50 beam splitter generated a reference light signal which was fed into an auto-balanced photo detector. The photo detector compared the first order diffracted beam from the grating with the reference light to improve the signal-to-noise ratio for high sensitivity.

Figure 12A:
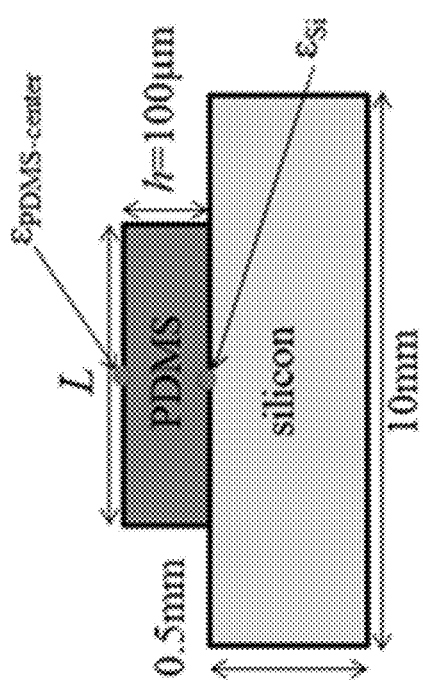
FIG. 12A shows a schematic of PDMS grating attached on silicon substrate.

Results and Discussion:

PDMS Effect:

The change in measured diffraction angle directly relates to the change in periodicity of the PDMS/Au grating: One glaring question that needs to answered is whether or not the strain on the grating reflects the underlying strain on the specimen of interest. The commercial finite element package ABAQUS was used to study this effect. FIG. 12A shows the model, including a PDMS grating with a thickness of 100 μm and length L on top of a 0.5 mm thick, 10 mm long silicon substrate. Thermal stress analysis is conducted by introducing a uniform temperature change ΔT The PDMS and silicon substrate is modeled by 4-node plane strain temperature-displacement coupled elements (CPE4T). The PDMS-Si interface is treated as shared nodes. The bottom of the silicon substrate is confined. The top Au layer is not considered in the finite element analysis because its thickness is negligible (10 nm). The following material parameters are used in the analysis: $E_{PDMS}=2$ MPa, $v_{PDMS}=0.5$, $\alpha_{PDMS}=310 \times 10^{-6}/°$ C., $E_{Si}=130$ GPa, $v_{Si}=0.3$, $\alpha_{Si}=2.6 \times 10^{-6}/°$ C., ΔT=50° C., where α is the coefficient of thermal expansion (CTE).

Figure 12B:
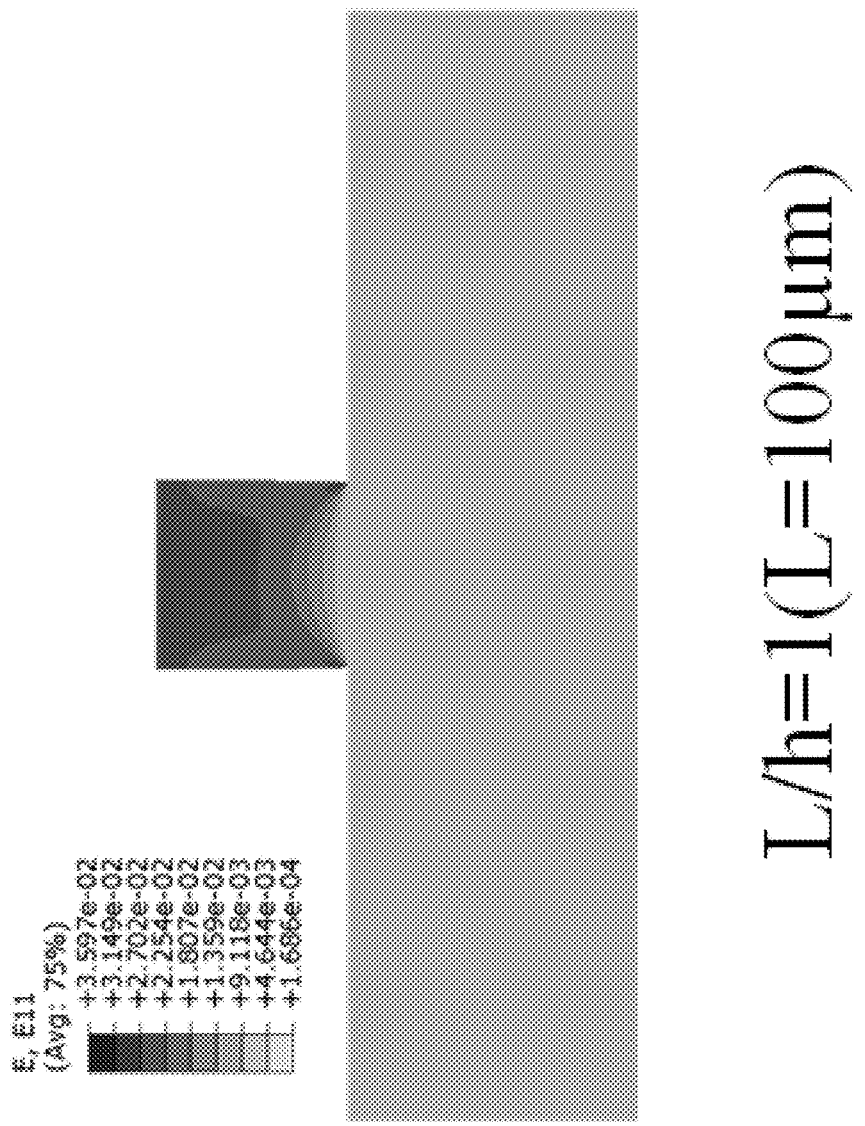
FIG. 12B shows a strain contour in the horizontal direction for a ratio of 1 where PDMS length (L) is 100 μm and a constant thickness (h=100 μm).
Figure 12C:
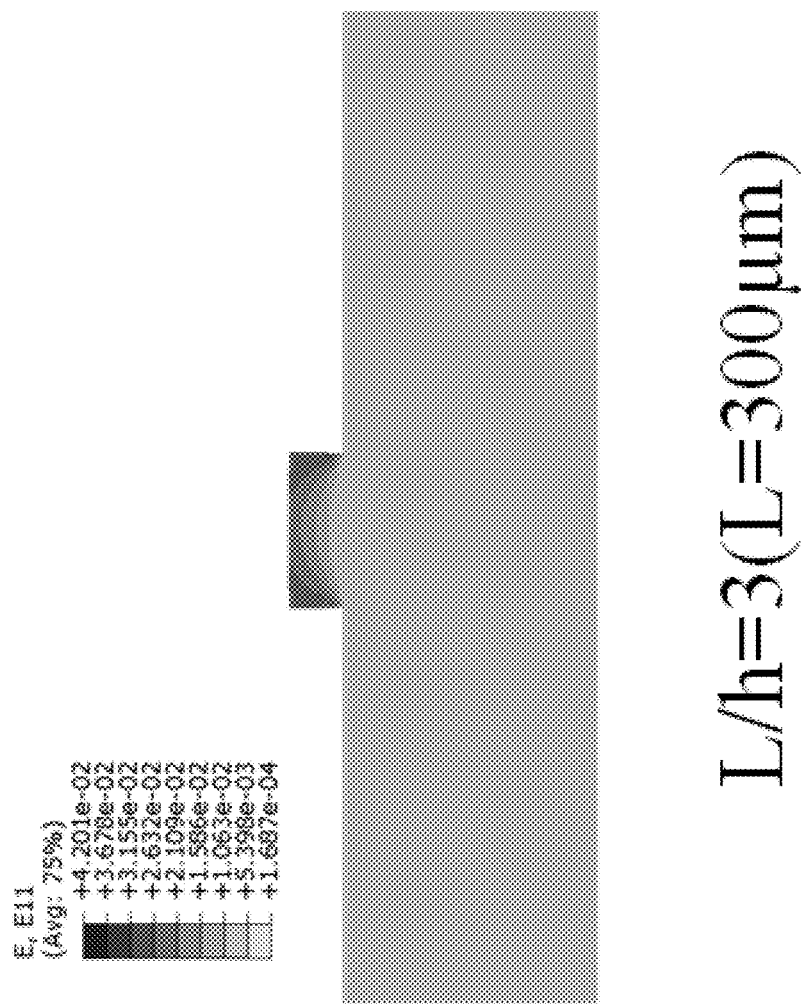
FIG. 12C shows a strain contour in the horizontal direction for a ratio of 3 where PDMS length (L) is 300 μm and a constant thickness (h=100 μm).
Figure 12D:
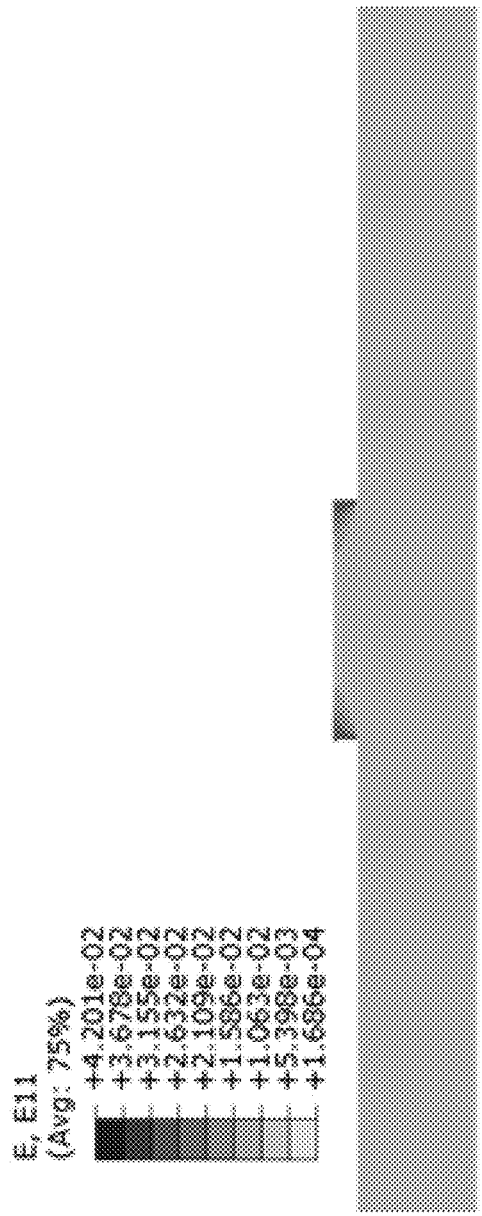
FIG. 12D shows a strain contour in the horizontal direction for a ratio of 10 where PDMS length (L) is 1 mm and a constant thickness (h=100 μm).
Figure 12E:
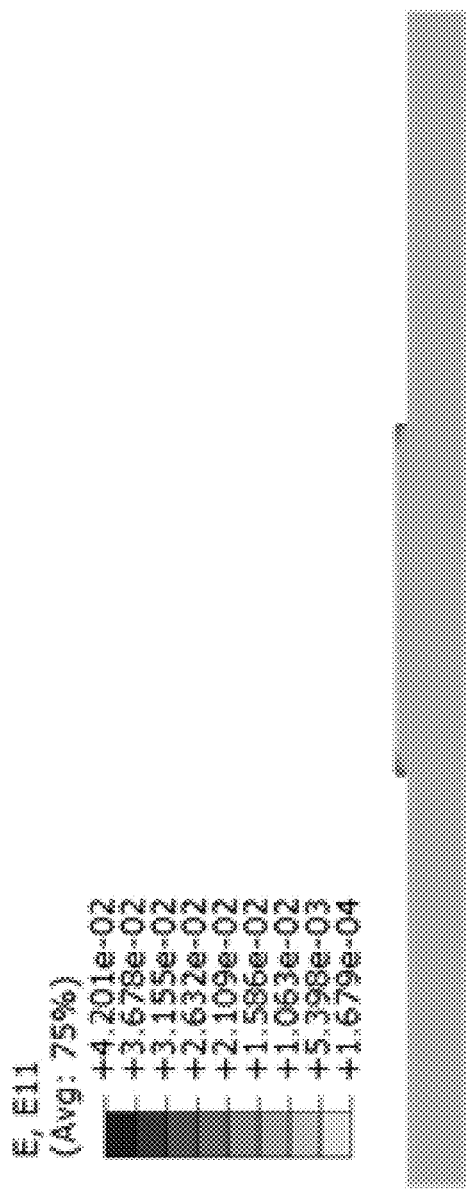
FIG. 12E shows a strain contour in the horizontal direction for a ratio of 30 where PDMS length (L) is 3 mm and a constant thickness (h=100 μm).

Strain contours in the horizontal direction for different ratios of PDMS length and thickness are shown in FIGS. 12B-E. For L/h=1, the strain at the top surface of the center of the PDMS ($\varepsilon_{PDMS}$) is about two orders of magnitude higher than the strain at the top of the silicon substrate ($\varepsilon_{Si}$). The explanation for this is that for a small L/h ratio, the constraint from the underlying silicon substrate is too weak. Therefore, the strain at the top of the PDMS grating, in this case, only reflects the PDMS itself and not the underlying silicon. As the L/h ratio increases, the constraint from the silicon substrate is increased and the strain at the top of the PDMS grating begins to resemble more and more like the strain of the underlying silicon specimen of interest, as can be seen in FIG. 12B. For an L/h ratio of 30, the strain of the PDMS grating is equal to the strain of the underlying silicon specimen of interest over 80% of the entire surface area of the PDMS grating. In this scenario, the detected strain $\varepsilon_{PDMS}$ reflects the actual strain $\varepsilon_{Si}$.

Figures 13A, 13B:
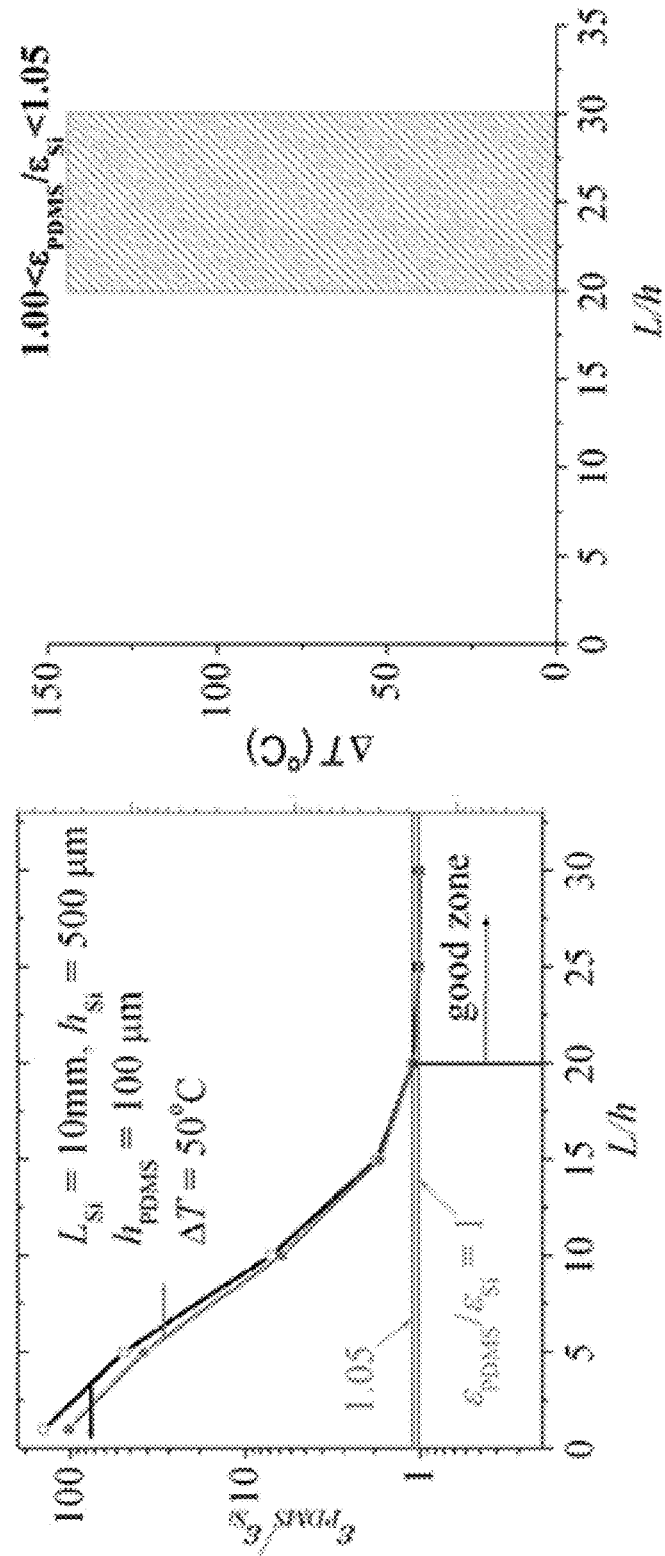
FIG. 13A shows $\varepsilon_{pdms}/\varepsilon_{Si}$ and $\varepsilon_{pdms}$ as a function of L/h.
FIG. 13B shows a phase diagram of $\varepsilon_{pdms}/\varepsilon_{Si}$.

FIG. 13A shows the ratio of $\varepsilon_{PDMS}$ and $\varepsilon_{Si}$ as a function of L/h ratio for PDMS grating on Si substrate. It can be seen that when the L/h ratio exceeds a critical value of 20, the $\varepsilon_{PDMS}$ reflects $\varepsilon_{Si}$ with only a 5% error. FIG. 13B shows that this relation (i.e., L/h>20) holds for all temperature changes due to the linearity of this relation. In fact, this analysis is likely to provide an upper bound of the L/h ratio because the CTE mismatch between silicon and PDMS is likely to be more severe than most conventional metals and polymers. However, note that for materials with a smaller CTE than silicon, such as, glass and other low CTE ceramics, the critical value for L/h ratio can be smaller than 20.

Figure 14A:
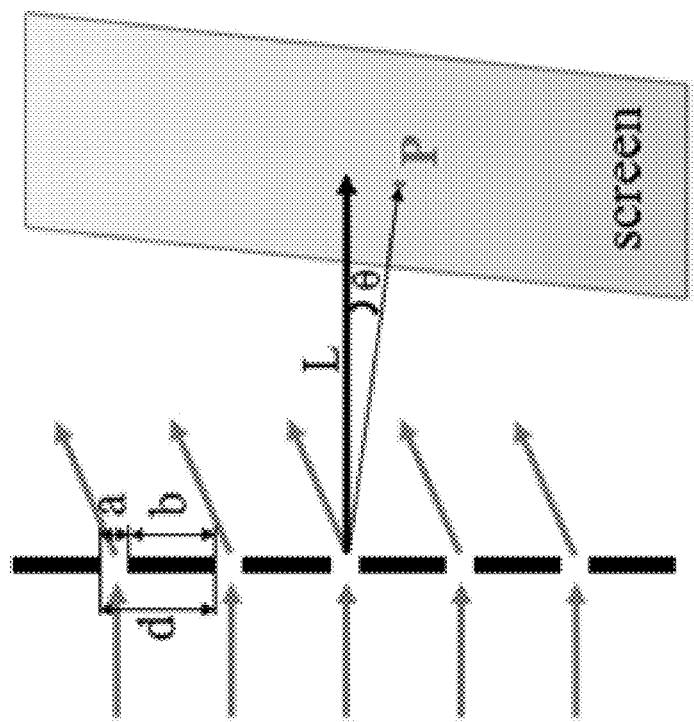
FIG. 14A shows diffracted beam intensity simulations based on the multi-slit grating model with grating to screen distance L=10 cm.

Simulation on Diffracted Laser Beam Intensity Variation:

Although the proposed method for strain measurement seems simple (FIG. 1B), it is important to consider whether or not the shift in the peak position of the diffraction light due to a small strain can be differentiated. The laser spot size is an important parameter to consider. FIG. 14A shows the simulation model with an N-slit grating, where N is the number of slits with periodicity d (=a+b) for each slit. In other words, it is assumed that the laser light is shone on these N slits with a spot size of Nd. Within each slit, the opening and blocking region sizes are a and b, respectively. The detector is modeled as a screen. It is assumed that the light is incident and normal to the slits with a fixed ratio of d/a. The superposition of the waves from all the points within a single slit at point P, on the screen has an expression of $$U_1 = \int du_1 = \int_0^a \frac{A_0}{a} e^{-i\omega t} e^{ikx\sin\theta} dx, \quad (2)$$

where $A_0$ is the amplitude of the waves, $k=2\pi/\lambda$ is the wave number of the incident light. The integration is over the opening area of the single slit.

At point P, the contribution from all N slits is expressed as the summation over all these N slits, $$U = A_0 \frac{\sin\alpha}{\alpha} \frac{\sin N\beta}{\beta} \exp\left\{i\frac{[a+(N-1)]\sin\theta}{\lambda}\omega t\right\}, \quad (3)$$

where $\alpha=(\pi a/\lambda)\sin\theta$, $\beta=(\pi d/\lambda)\sin\theta$.

Thus, the light intensity profile at point P is given by $$I_P = U^2 = I_0 \left(\frac{\sin\alpha}{\alpha}\right)^2 \left(\frac{\sin N\beta}{\beta}\right)^2. \quad (4)$$

where $I_0 = A_0^2$ is the intensity of light impinging on the diffraction grating.

Figure 14B:
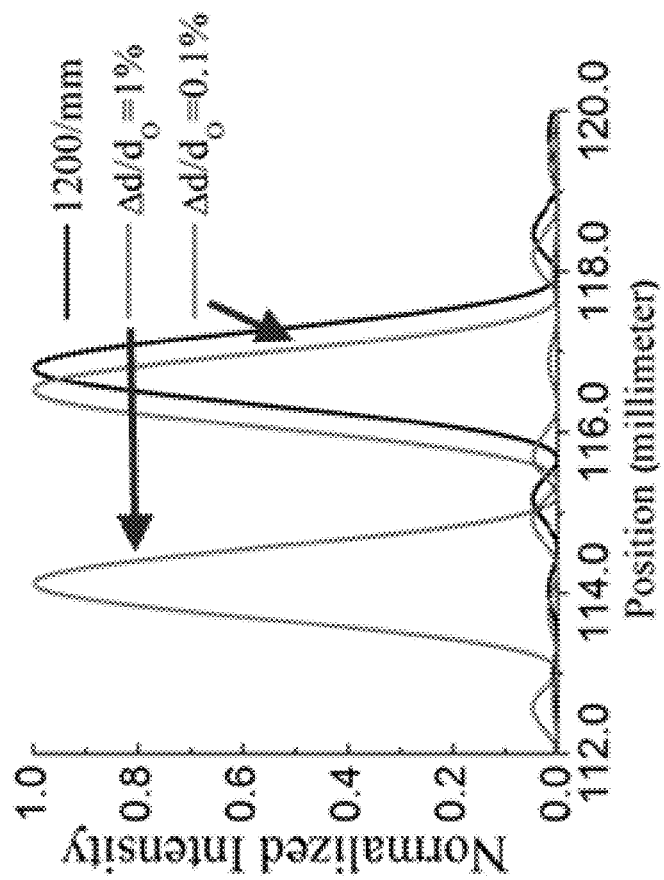
FIG. 14B graphically illustrates an effect of small variations applied to the grating periodicity to obtain the peak shift where spot size is 200 μm (or number of slits N=240).
Figure 14C:
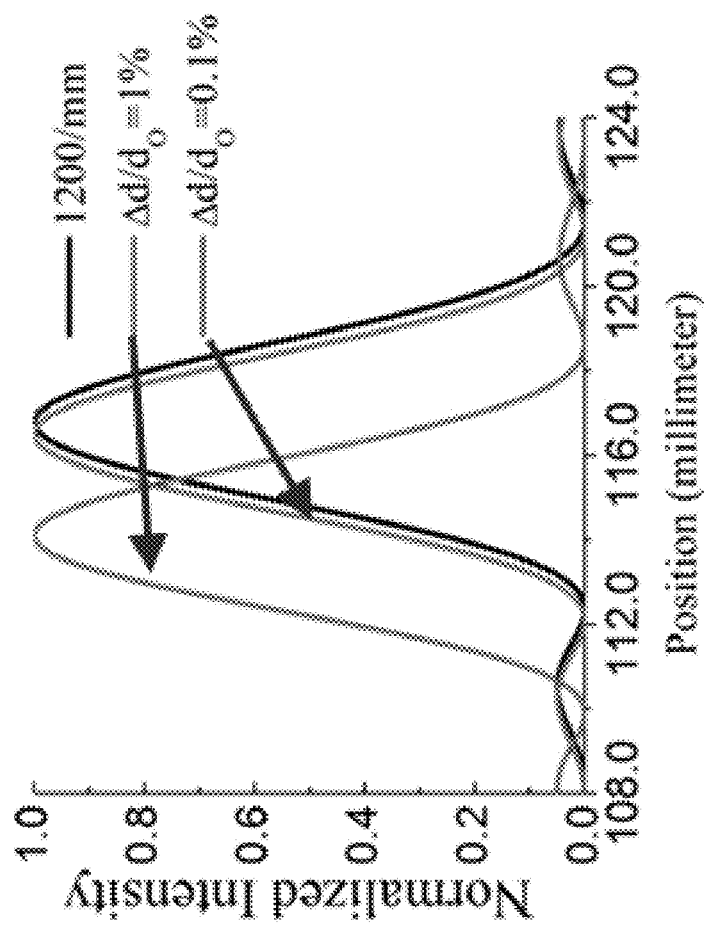
FIG. 14C graphically illustrates an effect of small variations applied to the grating periodicity to obtain the peak shift where spot size is 50 μm (or number of slits N=60).

FIG. 14B shows the first order diffraction patterns with a laser spot size of 200 μm and grating to screen distance L=10 cm. The black line indicates the measurement when no strain is applied, while the red and green lines represent intensity profile when 1% and 0.1% strain is applied, respectively. In this case, the laser wavelength is set to be 633 nm, the number of slits N is set to be 240, and the initial grating period is 833.3 nm (i.e., 1,200 lines/mm). FIG. 14C shows the same results as FIG. 14B but with a 50 μm laser spot size. It is clear that a smaller grating period variation leads to a smaller peak shift. This comparison suggests that a detector with high sensitivity is required to capture the localized strain variation with a very small laser spot size. Quantitative analysis indicating further reducing laser spot size to 10 μm and with N=12 for d=800 nm grating, a 0.1% strain will lead to light intensity change on the order of $10^{-4}$, well within the limit of the auto-balanced photo detector chosen in the experiment. The strain sensitivity in our detection scheme can be estimated. The auto-balanced photodetector used in our experiment can detect optical intensity variation on the order of $10^{-6}$; therefore, 1 nW intensity difference for 1 mW signal due to diffraction peak shift can be translated to a strain of $2.3\times10^{-6}$ for a laser spot size of 200 μm from simulation.

Figure 15A:
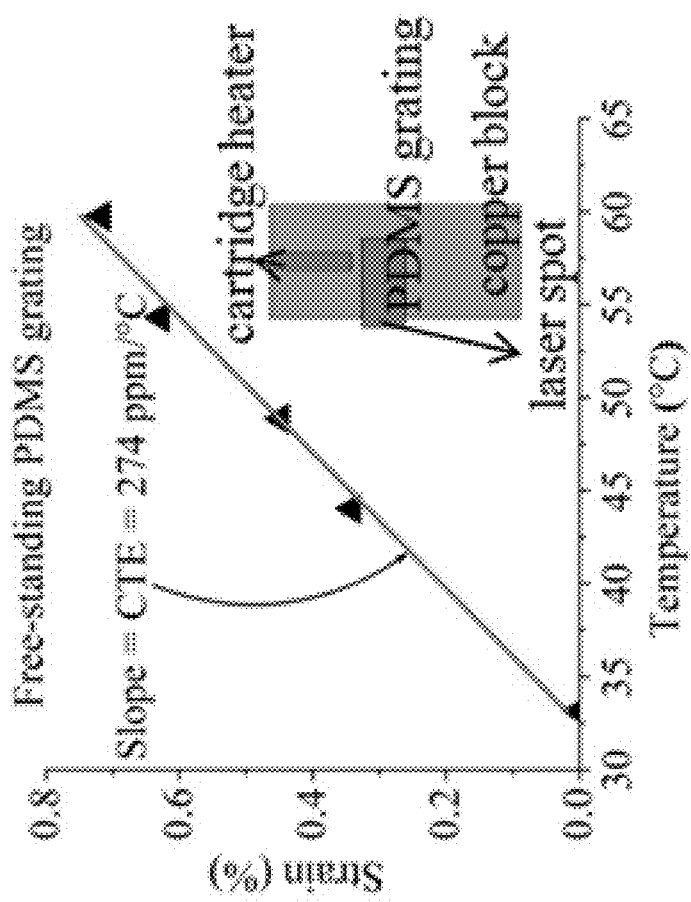
FIG. 15A shows measured CTE results for freestanding PDMS. Insets are the schematics of the setup for thermal micro-strain measurement.
Figure 15B:
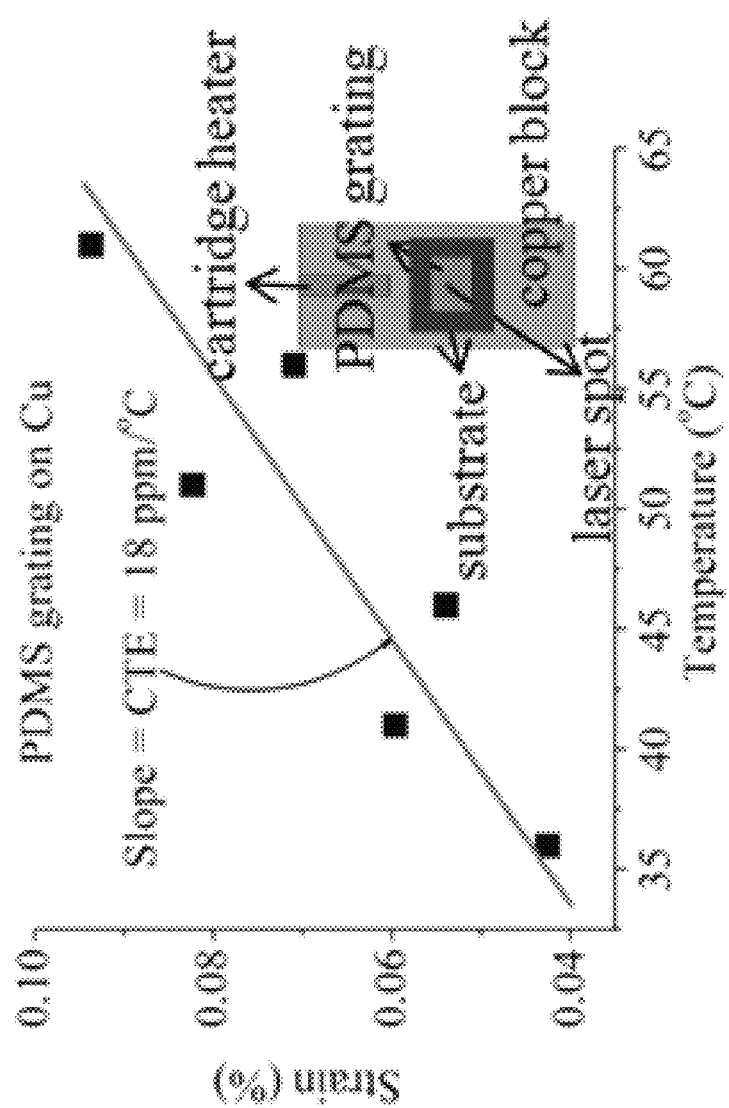
FIG. 15B shows measured CTE results for Cu. The inset is a schematic of the setup for thermal micro-strain measurement.
Figure 15C:
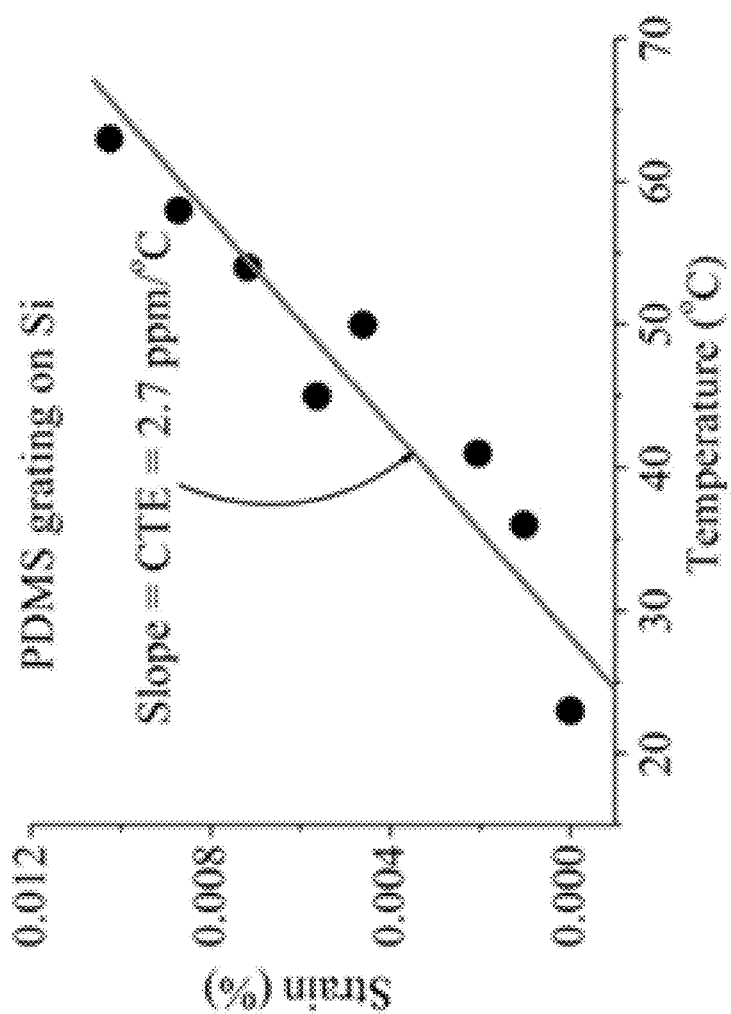
FIG. 15C shows measured CTE results for Si.

Benchmark of Strain Measurement:

To verify the micro-strain sensing technique with tunable PDMS/Au grating proposed earlier, thermal strains of various materials, with differing coefficient-of-thermal-expansions (CTE) spanning 3 orders of magnitude were measured. PDMS/Au gratings are bonded on specimens that are heated up by a copper block, as shown in FIGS. 15A-C. A thermal couple is attached to the copper block to form a feedback system for the temperature control. In this system, the temperature reading on the specimen is calibrated to be within one degree of accuracy, and the temperature range for the strain measurement is between room temperature and 65° C. The laser spot size is 200 μm.

The first specimen is a freestanding PDMS grating, which is hanging over at the edge of the copper block, as shown in the inset schematic in FIG. 15A. The focused laser spot is located just off the copper block to measure the thermal strain of the PDMS grating without constraints from the copper block. FIG. 15A shows the measured strain as a function of temperature for this freestanding PDMS grating, where a good linearity is observed. The CTE of PDMS, i.e., the slope of strain/temperature relation, is 274 ppm/° C. (part per million per degree Celsius), which agrees with the reference value of the CTE of PDMS, 265 ppm/° C., measured using commercial thermal-mechanical analysis tool Q400 from TA instruments, under expansion mode at 10 mN force.

The second specimen is a piece of copper sheet, on which the PDMS/Au grating is attached by a thin double-sided adhesive tape. The size of the PDMS/Au grating has been chosen based on FIG. 13A to ensure the measured strain on top of the grating accurately reflects the strain of the copper substrate. FIG. 15B shows the strain-temperature relation. The CTE of copper given by the slope is obtained as 18.2 ppm/° C., which is consistent with the CTE value of copper (17.5 ppm/° C.). Some of the data points in FIG. 15B are scattered compared to FIG. 15A, which can be attributed to the bonding quality of the adhesive tape between copper and PDMS.

The last specimen is a Si substrate. The PDMS/Au grating can be firmly bonded to the Si substrate by treating the Si surface with oxygen plasma to form a $SiO_2$ bond between the PDMS and Si. Si has a much lower CTE (2.6 ppm/° C.), compared to previous two specimen materials. The experimental data is plotted in FIG. 15C, which gives an extracted CTE value of 2.73 ppm/° C., very close to the reference value of the Si CTE. The measured data here show much less fluctuation than the data from the PDMS bonded to copper as the result of much better bonding quality between Si and PDMS. The successful measurement of such small strain on Si on the order of $10^{-5}$, or a few nanometers displacement within a 200 μm laser spot size, demonstrates the high strain sensitivity of this technique as a result of the unique grating fabrication technique and strain detection strategy. The results shown in FIGS. 15A-C are representative from many measurements we have performed, where several samples on each type of substrate were fabricated and measured, with each sample undergoing repeated temperature increase/decrease cycles, and the results show good repeatability.

PDMS tunable gratings fabricated through buckled film were used for micro-strain measurement of various materials. A highly sensitive optical setup optimized to amplify the small strain signal to the change in diffraction angle, orders of magnitude larger, was proposed. The applicability of the PDMS/Au grating to infer the strain of the underlying specimen of interest requires the L/h aspect ratio of the grating to be greater than 20 for most practical purposes. In addition, the laser spot size was demonstrated to influence the measurement resolution significantly. Lastly, the thermal strain measurement on the free-standing PDMS grating as well as the PDMS grating bonded to copper and Si substrates agree well with the reference CTE values of PDMS, copper and Si, respectively. This technique is simple for very high strain sensitivity measurement, and its potential spatial scanning capability is also expected to complement the application boundaries of other in-plane strain measurement metrologies such as Moire Interferometry or digital image correlation (DIC) methods in terms of maximum strain gradient, and field-of-view of measurement. In addition, unlike conventional in-plane strain sensing metrologies, the proposed technique is expected to work for non-planar surface geometry, as well.

Example 5—Grating Made Using Soft Optical Contact Lithography

Figure 16:
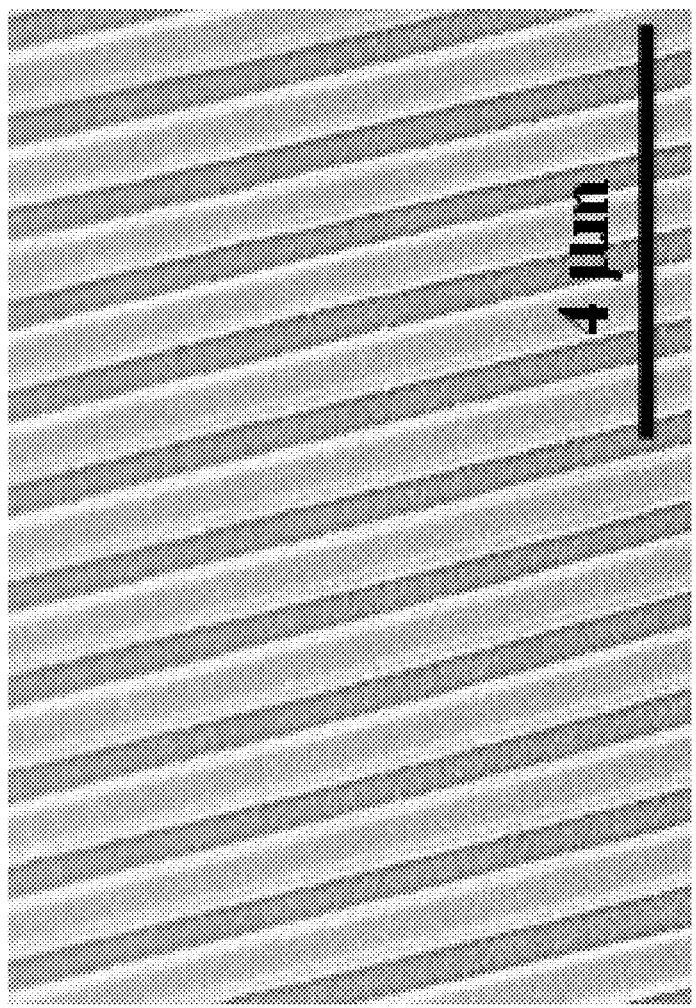
FIG. 16 shows a directly fabricated grating on a rough Cu surface.

The grating structure shown in FIG. 16 was made as follows: a 100-nm-thick copper film was deposited on a silicon wafer as a substrate for grating using e-beam evaporation and soft optical contact lithography and is then applied on this copper substrate using PDMS wrinkling as photo masks. After developing a sub-micron periodic pattern is transferred from PDMS wrinkling to photoresist. A 100-nm gold layer is then deposited on the substrate using e-beam evaporation. Photoresist is stripped off in acetone by lift-off and 100-nm-thick gold ribbons with sub-micron period are fabricated on the copper substrate as a grating.

Although certain presently preferred embodiments of the invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

What is claimed is:

1. A method for determining a strain on a surface of a substrate, the method comprising:
   providing a grating pattern on at least part of the surface;
   scanning a laser beam over the grating pattern, the laser beam having a spatial resolution between 1 µm and 200 µm;
   capturing, with a camera, light from the laser beam that is reflected from the grating pattern;
   measuring a diffraction pattern of the reflected light;
   determining a wavelength variation of the grating pattern based on the diffraction pattern;
   generating a diffraction light intensity map based on the wavelength variation of the grating pattern; and
   generating a strain distribution map of the substrate based on the diffraction light intensity map.

2. The method of claim 1, wherein the laser beam has a spot diameter of about 1 µm to about 100 µm.

3. The method of claim 1, wherein the grating pattern has a period of about 750 nm to about 850 nm.

4. The method of claim 1, wherein the grating pattern occupies the entire surface.

5. The method of claim 1, wherein the grating pattern has a constant period or a varying period.

6. The method of claim 1, wherein the grating pattern is formed directly on the substrate.

7. The method of claim 1, wherein the grating pattern is formed separately and adhered to the surface of the substrate.

8. The method of claim 1, wherein the grating pattern is formed by soft contact lithography or electron beam lithography.

9. The method of claim 1, wherein the substrate contains at least two different materials having different coefficients of thermoexpansion.

10. A method for producing a strain map of a surface of a substrate comprising the steps of
    providing a grating pattern on at least part of the surface;
    scanning a laser beam over the grating pattern;
    capturing, with a camera, light from the laser beam that is reflected from the grating pattern;
    generating a contour plot of grating wavelength versus position of the surface by combining a series of columns having a plurality of pixels defining a diffraction light intensity profile based on the reflected light;
    extracting a grating wavelength value from a greatest peak at each position to generate a strain distribution map of the surface.

11. The method of claim 10, wherein the laser beam has a spot diameter of about 1 µm to about 200 µm.

12. The method of claim 10, wherein the grating pattern has a period of 750 nm to about 850 nm.

13. The method of claim 10, wherein the grating pattern occupies the entire surface.

14. The method of claim 10, wherein the grating pattern has a constant period or a varying period.

15. The method of claim 10, wherein the grating pattern is formed directly on the substrate.

16. The method of claim 10, wherein the grating is formed separately and adhered to the surface of the substrate.

17. The method of claim 10, wherein the grating is formed by soft contact lithography or electron beam lithography.

18. The method of claim 10, wherein the substrate contains at least two different materials having different coefficients of thermoexpansion.

19. A method for determining a strain on a surface of a substrate, the method comprising:
    providing a grating pattern on at least part of the surface;
    scanning a laser beam over the grating pattern;
    capturing, with a camera, light from the laser beam that is reflected from the grating pattern;
    measuring a diffraction pattern of the reflected light;
    determining a wavelength variation of the grating pattern based on the diffraction pattern;
    generating a diffraction light intensity map based on the wavelength variation of the grating pattern; and
    generating a strain distribution map of the substrate based on the diffraction light intensity map.

* * * * *